(12) United States Patent
Ceglio et al.

(10) Patent No.: US 9,057,962 B2
(45) Date of Patent: Jun. 16, 2015

(54) SOURCE-COLLECTOR MODULE WITH GIC MIRROR AND LPP EUV LIGHT SOURCE

(71) Applicants: Natale M. Ceglio, Pleasanton, CA (US); Giovanni Nocerino, Pleasanton, CA (US); Fabio Zocchi, Samarate (IT)

(72) Inventors: Natale M. Ceglio, Pleasanton, CA (US); Giovanni Nocerino, Pleasanton, CA (US); Fabio Zocchi, Samarate (IT)

(73) Assignee: Media Lario S.R.L., Bosisio Parini (LC) (IT)

( * ) Notice: Subject to any disclaimer, the term of this patent is extended or adjusted under 35 U.S.C. 154(b) by 415 days.

(21) Appl. No.: 13/691,804

(22) Filed: Dec. 2, 2012

(65) Prior Publication Data

US 2014/0152967 A1 Jun. 5, 2014

Related U.S. Application Data

(63) Continuation of application No. 12/803,075, filed on Jun. 18, 2010, now Pat. No. 8,330,131.

(51) Int. Cl.
*G03F 7/20* (2006.01)
*G21K 1/06* (2006.01)

(52) U.S. Cl.
CPC .......... *G03F 7/70033* (2013.01); *G03F 7/2004* (2013.01); *G21K 1/067* (2013.01); *G21K 2201/064* (2013.01)

(58) Field of Classification Search
CPC .............. G03F 7/2004; G03F 7/70033; G03F 7/70916; G03F 7/70233; G03F 7/70908; G21K 1/067; G21K 2201/064
See application file for complete search history.

(56) References Cited

U.S. PATENT DOCUMENTS

| | | | | |
|---|---|---|---|---|
| 2,819,404 | A * | 1/1958 | Herrnring et al. | 378/43 |
| 6,278,764 | B1 * | 8/2001 | Barbee et al. | 378/84 |
| 7,075,713 | B2 * | 7/2006 | Arenberg | 359/359 |
| 7,079,224 | B2 * | 7/2006 | Tran et al. | 355/67 |
| 2004/0108465 | A1 * | 6/2004 | Bakker et al. | 250/492.1 |
| 2004/0183031 | A1 * | 9/2004 | Silverman et al. | 250/492.2 |
| 2005/0195506 | A1 * | 9/2005 | McGuire, Jr. | 359/861 |
| 2005/0274897 | A1 * | 12/2005 | Singer et al. | 250/372 |
| 2006/0072090 | A1 * | 4/2006 | Bakker | 355/53 |
| 2006/0176547 | A1 * | 8/2006 | Sasian | 359/359 |
| 2007/0102653 | A1 * | 5/2007 | Bowering et al. | 250/504 R |
| 2007/0146659 | A1 * | 6/2007 | Klunder et al. | 355/30 |
| 2009/0244696 | A1 * | 10/2009 | Geyl et al. | 359/359 |
| 2010/0090133 | A1 * | 4/2010 | Endo et al. | 250/504 R |
| 2011/0026002 | A1 * | 2/2011 | Loopstra et al. | 355/71 |
| 2011/0073785 | A1 * | 3/2011 | Mercier-Ythier et al. | 250/504 R |
| 2011/0168925 | A1 * | 7/2011 | Ceglio et al. | 250/504 R |

FOREIGN PATENT DOCUMENTS

WO    WO 2009095220 A2 *    8/2009

* cited by examiner

*Primary Examiner* — Steven H Whitesell Gordon
(74) *Attorney, Agent, or Firm* — Opticus IP Law, PLLC

(57) ABSTRACT

A source-collector module for an extreme ultraviolet (EUV) lithography system, the module including a laser-produced plasma (LPP) that generates EUV radiation and a grazing-incidence collector (GIC) mirror arranged relative thereto and having an input end and an output end. The LPP is formed using an LPP target system wherein a pulsed laser beam travels on-axis through the GIC and is incident upon solid, moveable LPP target. The GIC mirror is arranged relative to the LPP to receive the EUV radiation therefrom at its input end and and focus the received EUV radiation at an intermediate focus adjacent the output end. An example GIC mirror design is presented that includes a polynomial surface-figure correction to compensate for GIC shell thickness effects, thereby improve far-field imaging performance.

11 Claims, 21 Drawing Sheets

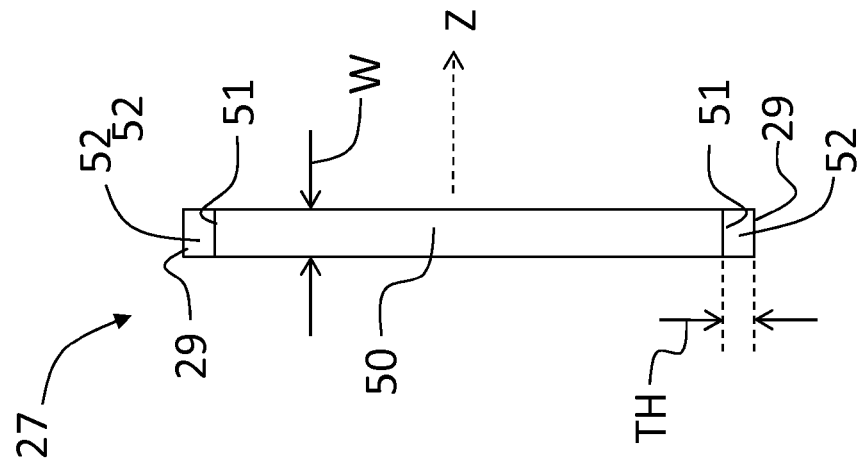
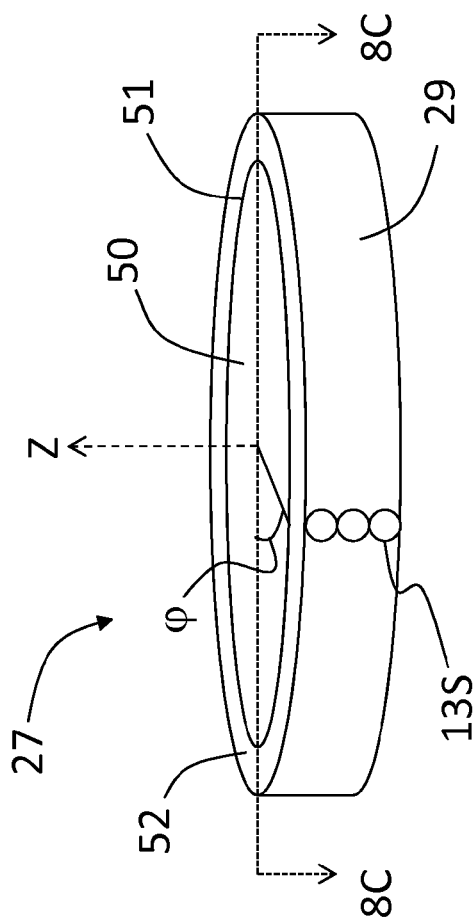
FIG. 8C
FIG. 8B

SOURCE-COLLECTOR MODULE WITH GIC MIRROR AND LPP EUV LIGHT SOURCE

CLAIM OF PRIORITY

This application is a continuation of U.S. patent application Ser. No. 12/803,075, filed on Jun. 18, 2010, which has issued on Dec. 11, 2012, as U.S. Pat. No. 8,330,131, and from which priority is claimed, and which application is incorporated by reference herein, and which claims the benefit of priority under 35 U.S.C. §119(e) of U.S. Provisional Application Ser. No. 61/335,700 filed on Jan. 11, 2010, which application is incorporated by reference herein.

FIELD

The present disclosure relates generally to grazing-incidence collectors (GICs), and in particular to a source-collector module for use in an extreme ultraviolet (EUV) lithography system that employs a laser-produced plasma.

BACKGROUND ART

Laser-produced plasmas (LPPs) are formed in one example by irradiating Sn droplets with a focused laser beam. Because LPPs can radiate in the extreme ultraviolet (EUV) range of the electromagnetic spectrum, they are considered to be a promising EUV radiation source for EUV lithography systems.

FIG. 1 is a schematic diagram of a generalized configuration for a prior art LPP-based source-collector module ("SOCOMO") 10 that uses a normal-incidence collector ("NIC") mirror MN, while FIG. 2 is a more specific prior art example configuration of the "LPP-NIC" SOCOMO 10 of FIG. 1. The LPP-NIC SOCOMO 10 includes a high-power laser source 12 that generates a high-power, high-repetition-rate laser beam 13 having a focus F13. LPP-NIC SOCOMO 10 also includes along an optical axis A1 a fold mirror FM and a large (e.g., ~600 mm diameter) ellipsoidal NIC mirror MN (having an on axis aperture hole to allow passage of the laser beam 13 to the target) that includes a surface 16 with a multilayer coating 18. The multilayer coating 18 is essential to guarantee good near normal mirror reflectivity at EUV wavelengths. LPP-NIC SOCOMO 10 also includes a Sn pellet (droplet) source 20 that emits a stream of Sn pellets (droplets) 22 that pass through focus F13 for the laser beam 13.

In the operation of LPP-NIC SOCOMO 10, laser beam 13 irradiates Sn pellets (droplets) 22 as the pellets pass through the focus F13 for the laser beam 13, thereby produce a high-power LPP 24. LPP 24 typically resides on the order of hundreds of millimeters from NIC mirror MN and emits EUV radiation 30 as well as energetic Sn ions, particles, neutral atoms, and infrared (IR) radiation. The portion of the EUV radiation 30 directed toward NIC mirror MN is collected by the NIC mirror MN and is directed (focused) to an intermediate focus IF to form an intermediate focal spot FS.

Advantages of LPP-NIC SOCOMO 10 are that the optical design is simple (i.e., uses a single ellipsoidal NIC mirror) and the nominal collection efficiency can be high because NIC mirror MN can be designed to collect a large angular fraction of the EUV radiation 30 emitted from LPP 24. It is noteworthy that the use of the single-bounce reflective NIC mirror MN placed on the opposite side of LPP 24 from the intermediate focus IF, while geometrically convenient, requires that the Sn pellet (droplet) source 20 not significantly obstruct EUV radiation 30 being delivered from the NIC mirror MN to the intermediate focus IF. Thus, there is generally no obscuration in the LPP-NIC SOCOMO 10 except perhaps for the hardware needed to generate the stream of Sn pellets (droplets) 22.

LPP-NIC SOCOMO 10 works well in laboratory and experimental arrangements where the lifetime and replacement cost of LPP-NIC SOCOMO 10 are not major considerations. However, a commercially viable EUV lithography system requires a SOCOMO that has a long lifetime. Unfortunately, the proximity of the surface 16 of NIC mirror MN and the multilayer coatings 18 thereon to LPP 24, combined with the substantially normally incident nature of the radiation collection process, makes it highly unlikely that the multilayer coating 18 will remain undamaged for any reasonable length of time under typical EUV-based semiconductor manufacturing conditions. The damage can come from ions incident on the multilayer coating 18 causing mixing and or absorption of EUV radiation 30; from Sn atoms which could coat the multilayer coating 18 and thereby inhibit reflection of the EUV radiation 30; from thermal loading; and/or from ionizing EM radiation; and/or from energetic electrons.

A further drawback of the LPP-NIC SOCOMO 10 is that it cannot easily be used in conjunction with a physical debris mitigation device (DMD) because the DMD would obstruct the EUV radiation 30 from being reflected from NIC mirror MN. In addition the NIC architecture using a high rep-rate droplet target places precise rep-rate demands on the laser system which adds to the cost of the laser system and adds additional reliability risk to the SOCOMO system.

Multilayer coating 18 is also likely to have its performance significantly reduced by the build-up of Sn. Even a few nanometers of such build-up will significantly absorb the EUV radiation 30 and reduce the reflectivity of the multilayer coating 18. Also, the aforementioned energetic ions, atoms and particles produced by LPP 24 will bombard multilayer coating 18 and can destroy the layered order of the top layers of the multilayer coating 18. In addition, the energetic ions, atoms and particles will erode multilayer coating 18, and the attendant thermal heating from the generated IR radiation can act to mix or interdiffuse the separate layers of the multilayer coating 18.

While a variety of subsystems have been proposed to mitigate the above-identified problems with LPP-NIC SOCOMO 10, they all add substantial cost, reliability risk and complexity to the SOCOM system, to the point where it becomes increasingly unrealistic to include it in a commercially viable EUV lithography system. What is needed therefore is a less expensive, less complex, more robust and generally more commercially viable SOCOMO for use in an EUV lithography system that uses an LPP-based EUV radiation source.

SUMMARY

The present disclosure is generally directed to grazing incidence collectors (GICs), and in particular to GIC mirrors used to form a source-collector module (SOCOMO) for use in EUV lithography systems that have a LPP-based EUV light source based on a movable Sn target with a much simpler architecture then a droplet system—such as described earlier. Such simple architecture could include a rotating Sn-coated wheel or disk. Aspects of the LPP-GIC SOCOMO include a debris-mitigation device arranged between the LPP source and GIC mirror to reduce the thermal and debris load on the GIC and thereby extend the lifetime of the GIC mirror.

An aspect of the invention is a source-collector module for an extreme ultraviolet (EUV) lithography system. The source-collector module includes a laser, a solid laser-produced plasma (LPP) target and a grazing-incidence collector (GIC) mirror. The laser generates a pulsed laser beam along a source-collector module axis. The solid laser-produced plasma (LPP) target has a surface configured to receive the pulsed laser beam and create an LPP that generates EUV radiation. The grazing-incidence collector (GIC) mirror has an input end and an output end. The GIC mirror is arranged to receive the EUV radiation at the input end and focus the received EUV radiation at an intermediate focus adjacent the output end.

In the source-collector module, the GIC mirror preferably provides a first reflecting surface that does not have a multilayer coating covering a significant portion of the first reflecting surface.

In the source-collector module, the GIC mirror preferably includes a Ru coating.

In the source-collector module, the GIC mirror preferably includes a multilayer coating.

In the source-collector module, the GIC mirror preferably includes at least one segmented GIC shell having the first reflecting surface and a second reflecting surface, with the second reflecting surface having a multilayer coating.

In the source-collector module, the laser beam preferably travels through the GIC from the output end to the input end and then to the LPP target surface.

In the source-collector module, the LPP target surface preferably includes a coating of LPP-generating material formed atop a substrate.

In the source-collector module, the LPP target surface preferably includes one of Sn and Xe.

The source-collector module preferably further includes a radiation-enhancement collection device disposed between the GIC mirror output end and the intermediate focus and configured to direct EUV radiation to the focus spot.

Another aspect of the invention is an extreme ultraviolet (EUV) lithography system for illuminating a reflective reticle. The EUV lithography system includes the above-mentioned source-collector module and an illuminator. The illuminator is configured to receive the focused EUV radiation formed at the intermediate focus and from condensed EUV radiation for illuminating the reflective reticle.

The EUV lithography system preferably forms a patterned image on a photosensitive semiconductor wafer. The EUV lithography system preferably further includes a projection optical system. The projection optical system is arranged downstream of the reflective reticle and configured to receive reflected EUV radiation from the reflective reticle and form therefrom the patterned image on the photosensitive semiconductor wafer.

Another aspect of the invention is a method of collecting extreme ultraviolet (EUV) radiation from a laser-produced plasma (LPP). The method includes providing a grazing incidence collector (GIC) mirror along an axis. The GIC mirror having input and output ends. The method also includes arranging adjacent the GIC mirror input end an LPP target system having a solid LPP target with a target surface. The method also includes sending a pulsed laser beam down the GIC axis and through the GIC from the output end to the input end and to the target surface while moving the LPP target to form the LPP that emits the EUV radiation. The method further includes collecting with the GIC mirror at the GIC input end a portion of the EUV radiation from the LPP and directing the collected radiation out of the GIC mirror output end to form a focus spot at an intermediate focus.

The method preferably further includes employing a radiation collection enhancement device arranged between the GIC output end and the intermediate focus to direct EUV radiation to the focus spot that would not otherwise be directed to the focus spot by the GIC mirror.

The method preferably further includes providing the target as a movable substrate having a coating of LPP-generating material formed thereon. The LPP-generating material includes Sn or Xe.

In the method, the substrate preferably has a surface and an edge. And the method preferably further includes providing the coating on at least one of the surface and the edge.

The method preferably further includes providing the GIC mirror with a first reflecting surface that does not have a multilayer coating.

In the method, the GIC mirror preferably includes a Ru coating.

In the method, the GIC mirror preferably includes a multilayer coating.

In the method, the GIC mirror preferably includes at least one segmented GIC shell that includes the first reflecting surface and a second reflecting surface, with the second reflecting surface having the multilayer coating.

The method preferably further includes forming from EUV radiation at the intermediate focus condensed EUV radiation for illuminating a reflective reticle.

The method preferably further includes receiving reflected EUV radiation from the reflective reticle and forming therefrom the patterned image on the photosensitive semiconductor wafer using a projection optical system.

Another aspect of the invention is a grazing incidence collector (GIC) mirror having an input end and an output end and for use with a laser-produced plasma (LPP) target system that generates an LPP that emits extreme ultraviolet (EUV) radiation. The GIC mirror includes three concentrically arranged innermost GIC shells and five outermost GIC shells. The three concentrically arranged innermost GIC shells have an elliptical shape. The five outermost GIC shells concentrically surround the three innermost GIC shells. And the five outermost GIC shells provide a double reflection of the EUV radiation, with each of the outermost GIC shells having a curvature defined by revolving an elliptical section and a hyperbolic section around a common axis not coincident with respective ellipse and hyperbola axes. And the five outermost GIC shells are respectively configured to provide a single reflection for EUV radiation that enters the input end and exits the output end.

In the GIC mirror, each GIC shell has a thickness. The GIC shell preferably includes a polynomial surface-figure correction to uniformize variations in an intermediate image due to the GIC shell thickness.

Another aspect of the invention is a source collector module (SOCOMO) for an extreme ultraviolet (EUV) lithography system. The SOCOMO includes the above-mentioned GIC mirror and the LPP target system. The LPP target system is configured so that the LPP is formed adjacent the input end of the GIC mirror.

Additional features and advantages of the disclosure are set forth in the detailed description below, and in part will be readily apparent to those skilled in the art from that description or recognized by practicing the disclosure as described herein, including the detailed description which follows, the claims, as well as the appended drawings.

BRIEF DESCRIPTION OF THE DRAWINGS

FIG. 8B is a perspective view and FIG. 8C is a cross-sectional view of an example LPP target of FIG. 8A, as taken along the line 8C-8C, showing an example target substrate with its edge coated with an LPP-generating material;

Figure 1:
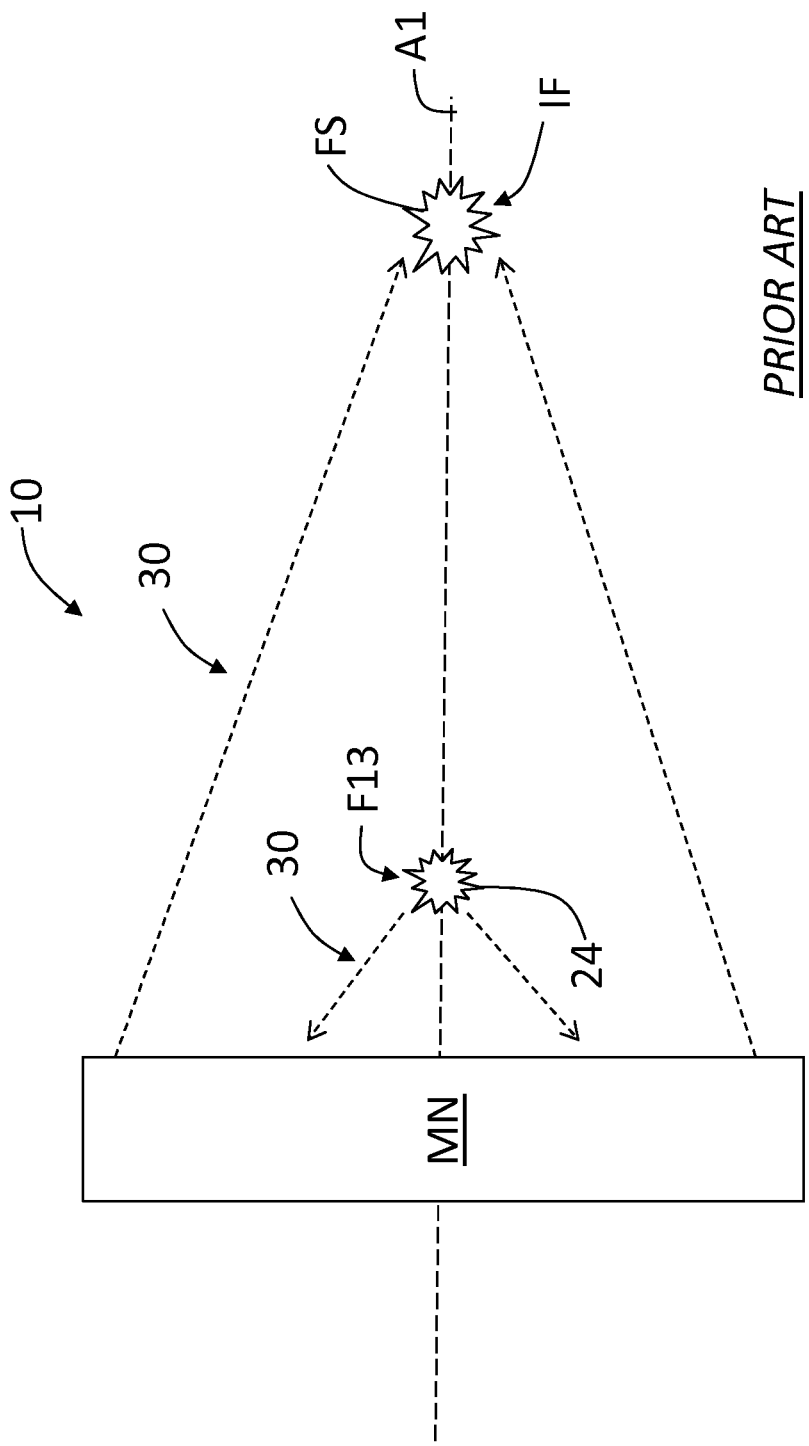
FIG. 1 is a schematic diagram of a generalized example prior art LPP-NIC SOCOMO.
Figure 2:
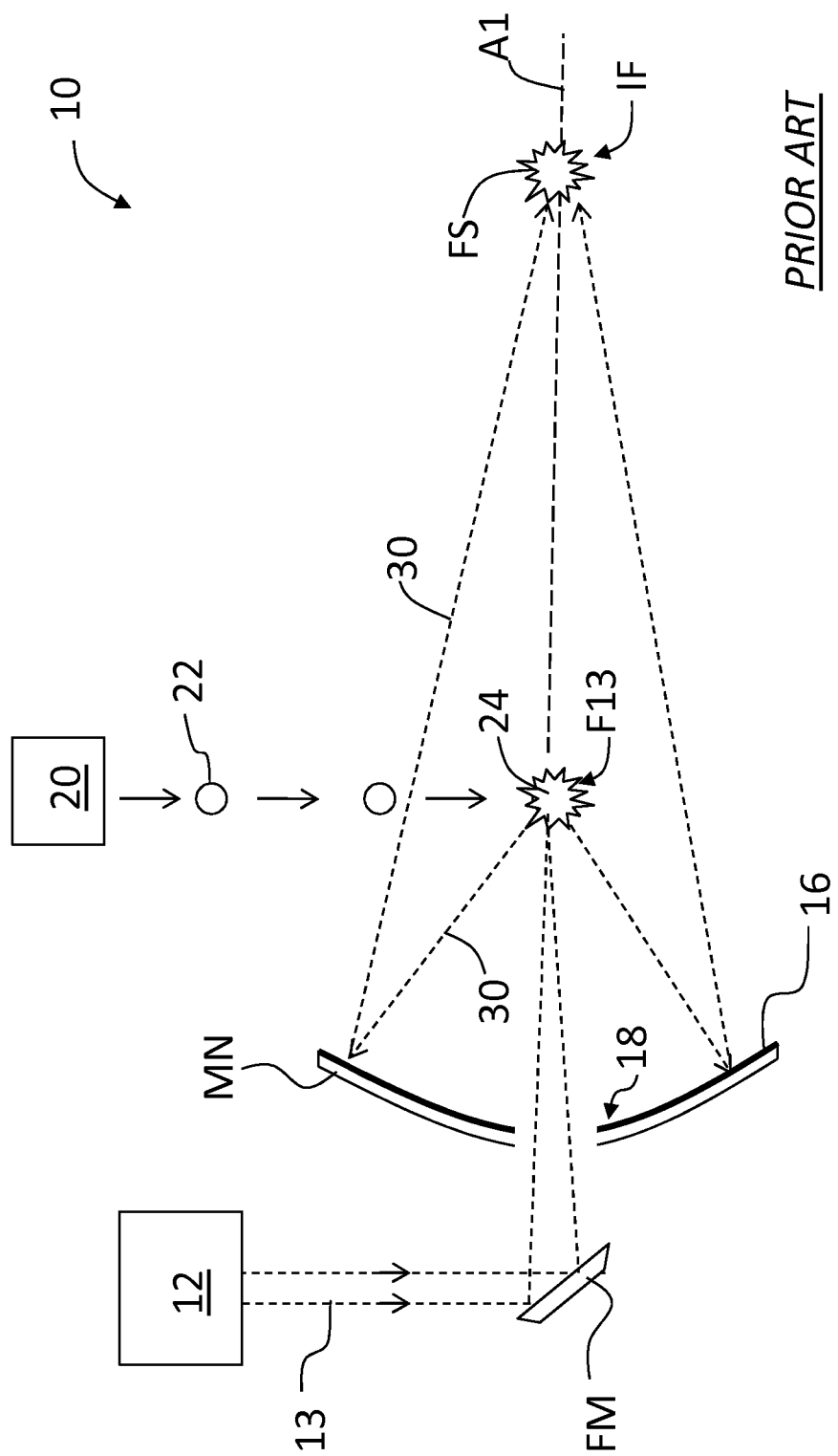
FIG. 2 is a schematic diagram of a particular example of a prior art LPP-NIC SOCOMO in accordance with FIG. 1.

The various elements depicted in the drawing are merely representational and are not necessarily drawn to scale. Certain sections thereof may be exaggerated, while others may be minimized. The drawing is intended to illustrate an example embodiment of the disclosure that can be understood and appropriately carried out by those of ordinary skill in the art.

DETAILED DESCRIPTION

The present disclosure is generally directed to GICs, and in particular to GIC mirrors used to form a source-collector module (SOCOMO) for use in EUV lithography systems that have a LPP-based EUV light source. Aspects of the LPP-GIC SOCOMO may include a debris-mitigation device (DMD) arranged between the LPP and GIC mirror to extend the lifetime of the GIC mirror.

Figure 3A:
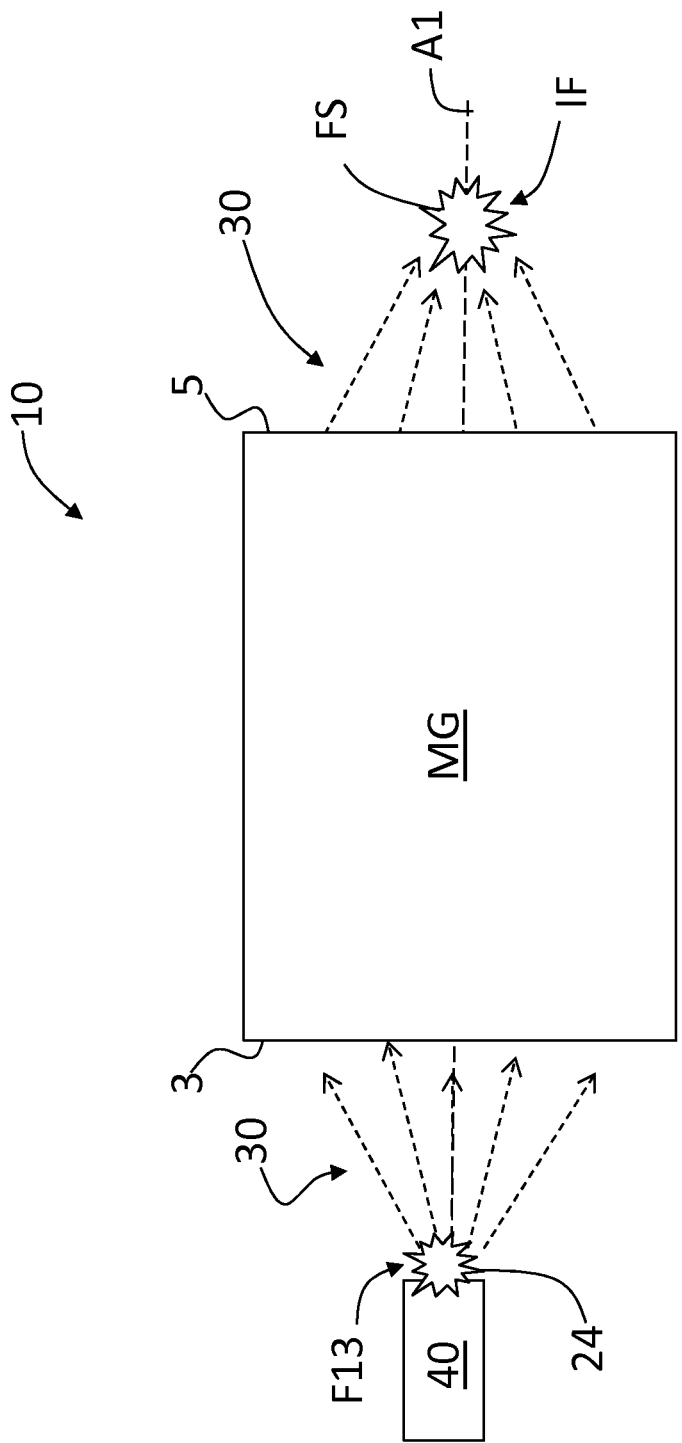
FIG. 3A is a generalized schematic diagram of an example GIC-based SOCOMO for an LPP source ("LPP-GIC SOCOMO"), wherein the LPP and intermediate focus are on opposite sides of the GIC mirror.

FIG. 3A is a generalized schematic diagram of example LPP-GIC SOCOMO 100, wherein LPP 24 and intermediate focus IF are on opposite sides of a GIC mirror MG. GIC mirror MG has an input end 3 and an output end 5. An LPP target system 40 that generates LPP 24 is also shown, and examples of the LPP target system 40 are discussed in detail below.

Figure 3B:
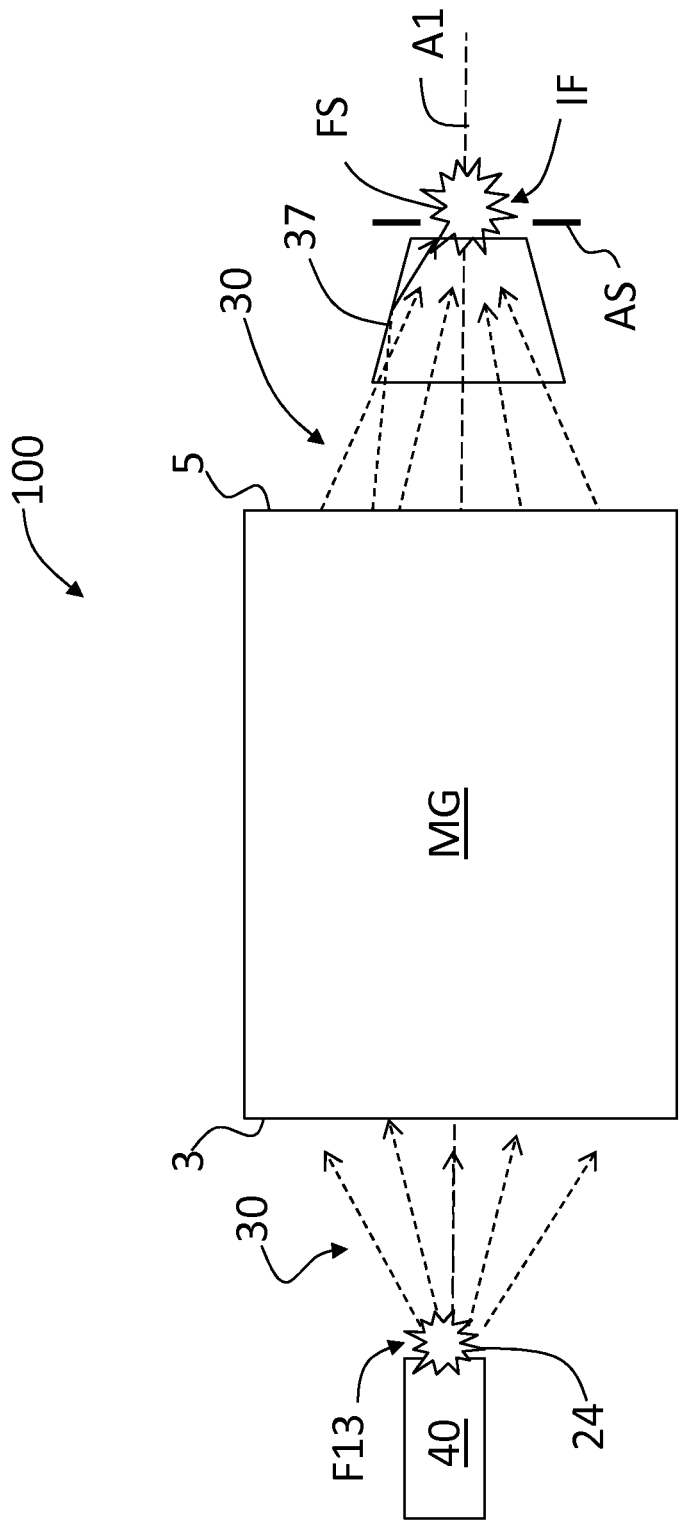
FIG. 3B is similar to FIG. 3A, but illustrating an example LPP-GIC SOCOMO that includes a radiation-collection enhancement device (RCED)

FIG. 3B is similar to FIG. 3A, but illustrating an example LPP-GIC SOCOMO 100 that includes a radiation-collection enhancement device (RCED) 37 arranged adjacent an aperture stop AS at or near where an intermediate focus spot FS is formed. RCEDs 37 are discussed in U.S. Provisional Patent Application No. 61/341,806, entitled "EUV collector system with enhanced EUV radiation collection," which application is incorporated by reference herein. RCED 37 is disposed between the output end of GIC mirror MG and the intermediate focus spot FS and is configured to direct EUV radiation 30 to the intermediate focus spot FS that would not otherwise contribute to forming the intermediate focus spot FS.

Figure 4:
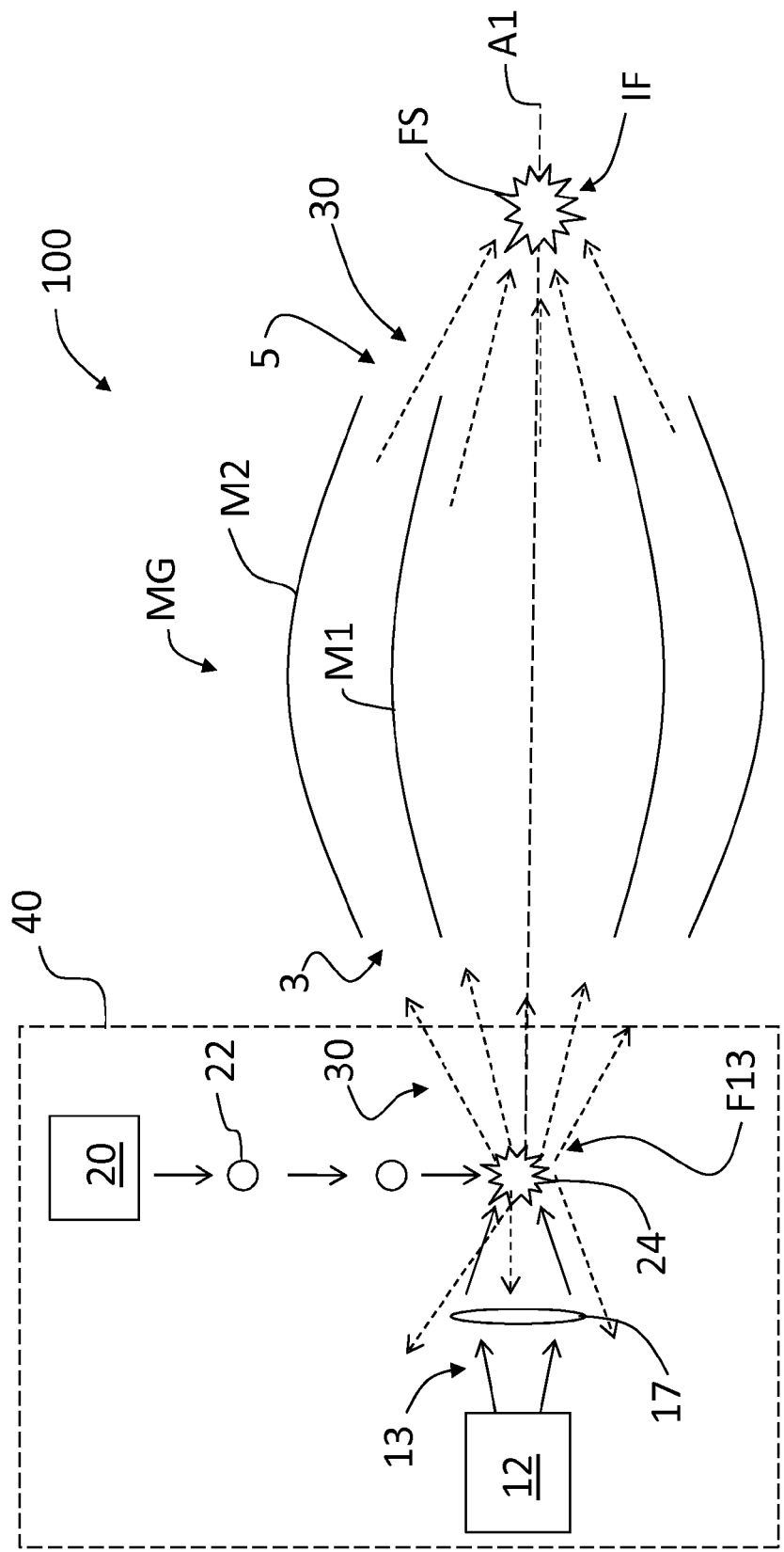
FIG. 4, FIG. 5A, FIG. 5B, and FIGS. 6A and 6B are schematic diagrams of example LPP-GIC SOCOMOs according to the present disclosure and the generalized configuration of FIG. 3.

FIG. 4 is a schematic diagram of an example LPP-GIC SOCOMO 100 based on the general configuration of FIG. 3A. LPP-GIC SOCOMO 100 of FIG. 4 utilizes an LPP target system 40 having a Sn pellet (droplet) source 20 that generates the aforementioned series of Sn pellets (droplets) 22. In the present embodiment, Sn pellets (droplets) 22 are relatively low-mass pellets that when irradiated with laser beam 13 generate substantially isotropic EUV radiation 30. This allows for a configuration where multi-shell GIC mirror MG (shown with two GIC shells M1 and M2) is arranged along optical axis A1 between LPP 24 and intermediate focus IF. A lens 17 assists in focusing laser beam 13 to focus F13. In an example embodiment, GIC shells M1 and M2 include Ru coatings, which are relatively stable and can tolerate a certain amount of Sn coating from LPP 24 without significantly reducing the reflectivity of the GIC mirrors MG.

Figure 5A:
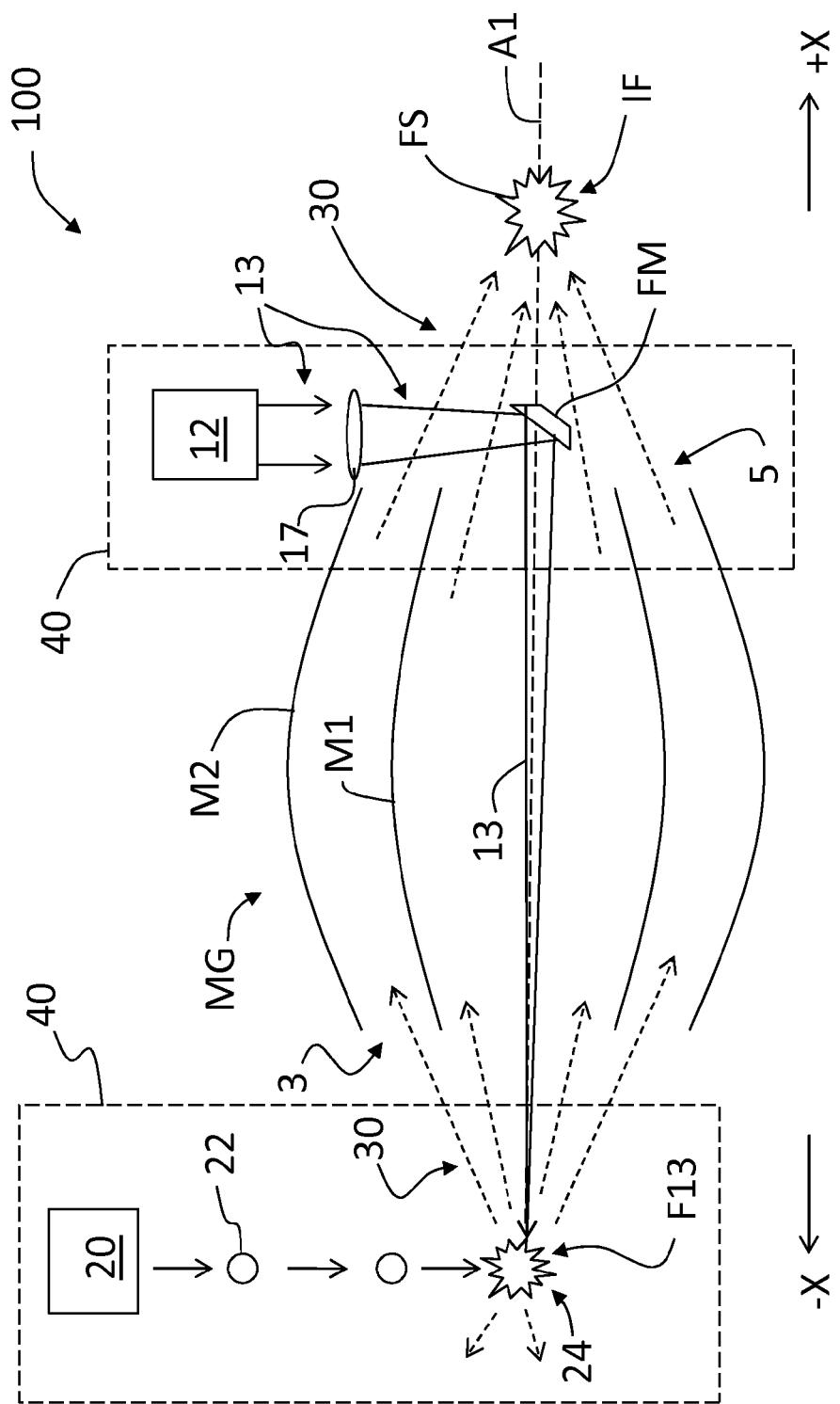

LPP-GIC SOCOMO 100 of FIG. 5A is similar to that of FIG. 4, except that Sn pellets (droplets) 22 are relatively high-mass pellets that result in an anisotropic emission of EUV radiation 30 when irradiated by focused laser beam 13. In LPP-GIC SOCOMO 100 of FIG. 5A, laser source 12, focusing lens 17 and fold mirror FM are arranged so that Sn pellets (droplets) 22 are irradiated in the −X direction along optical axis A1, thereby creating EUV radiation 30 that is emitted substantially in the +X direction. The axial obscuration presented by fold mirror FM is minimal because of the finite diameter of the innermost GIC shell. Thus, laser beam 13 travels in one direction through GIC mirror MG generally along optical axis A1 and EUV radiation 30 travels in the opposite direction through the GIC mirror MG and to intermediate focus IF.

Figure 5B:
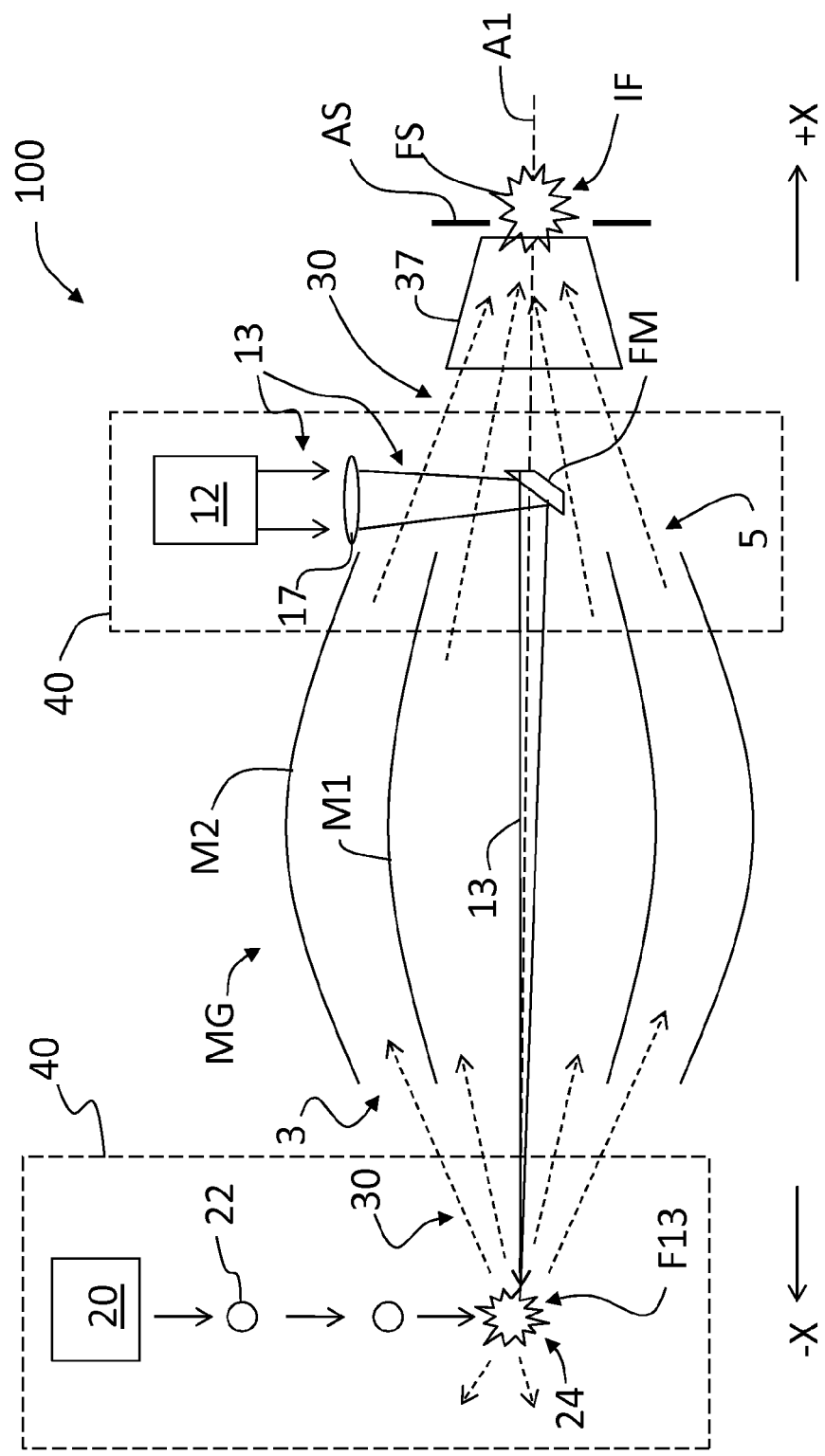

FIG. 5B is similar to FIG. 5A, but with the LPP-GIC SOCOMO 100 including an RCED 37 arranged adjacent aperture stop AS at or near where intermediate focus spot FS is formed.

Figure 6A:
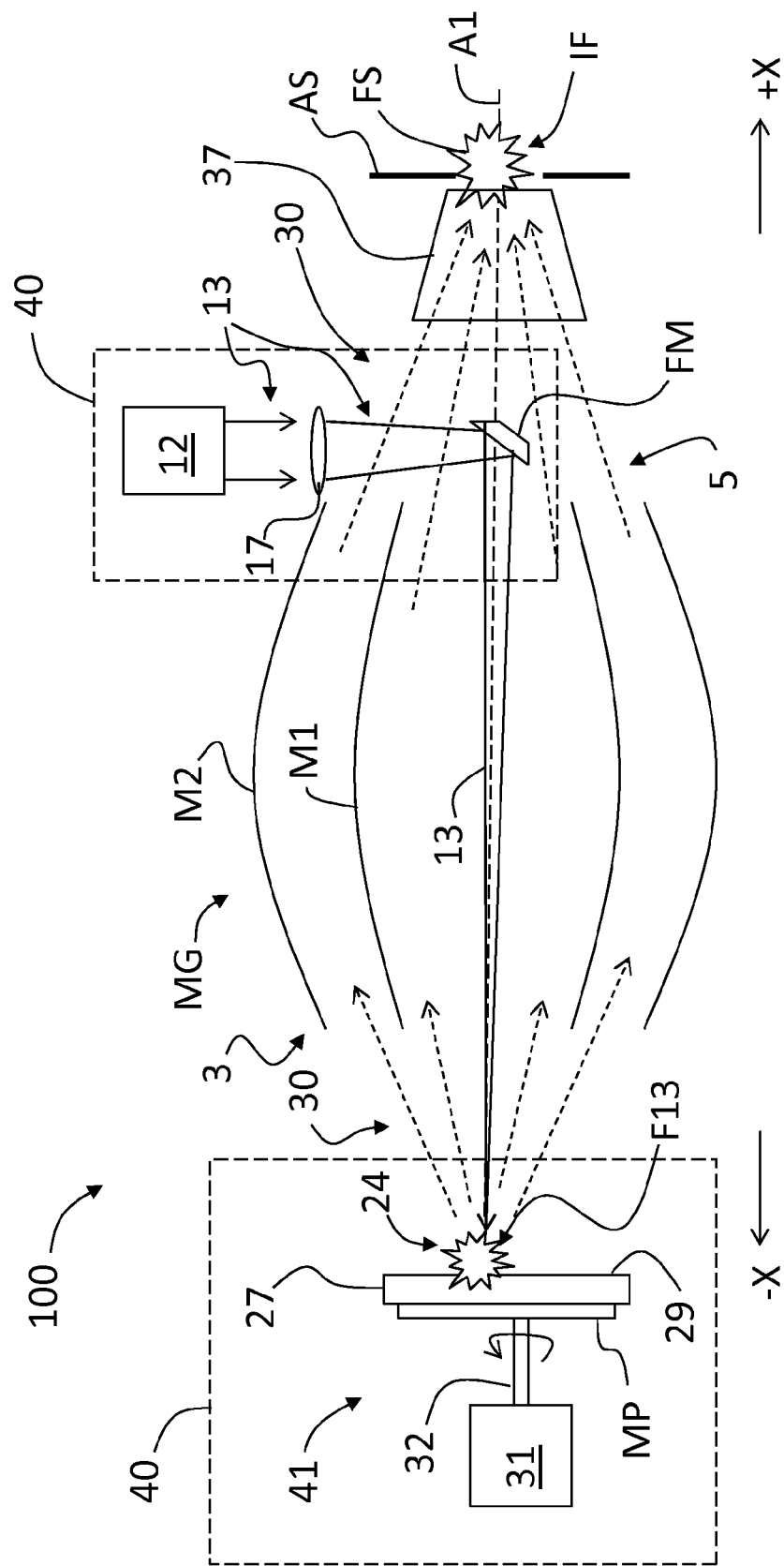

LPP-GIC SOCOMO 100 of FIG. 6A is similar to that of FIG. 5A, except that LPP target system 40 includes a relatively high-mass, solid, moveable LPP target 27 having a surface 29. In various examples, LPP target material may include Sn or Xe. LPP target system 40 includes a target assembly 41 having target driver 31 (e.g., a motor), a drive shaft 32 attached to the target driver 31, and a mounting plate MP attached to the drive shaft 32. LPP target 27 mounts to mounting plate MP. The incident laser beam 13 from laser source 12 is directed to travel axially through GIC mirror MG in the −X direction and is incident upon the surface 29 of LPP target 27 to form LPP 24. Moving LPP target 27 allows for laser beam 13 to be incident upon surface 29 of LPP target 27 at a different location for each laser pulse, or to have a limited number of laser pulses for each target location. The EUV radiation 30 from LPP 24 formed on LPP target 27 is generally emitted in the +X direction and travels through GIC mirror MG in the opposite direction of laser beam 13.

Figure 6B:
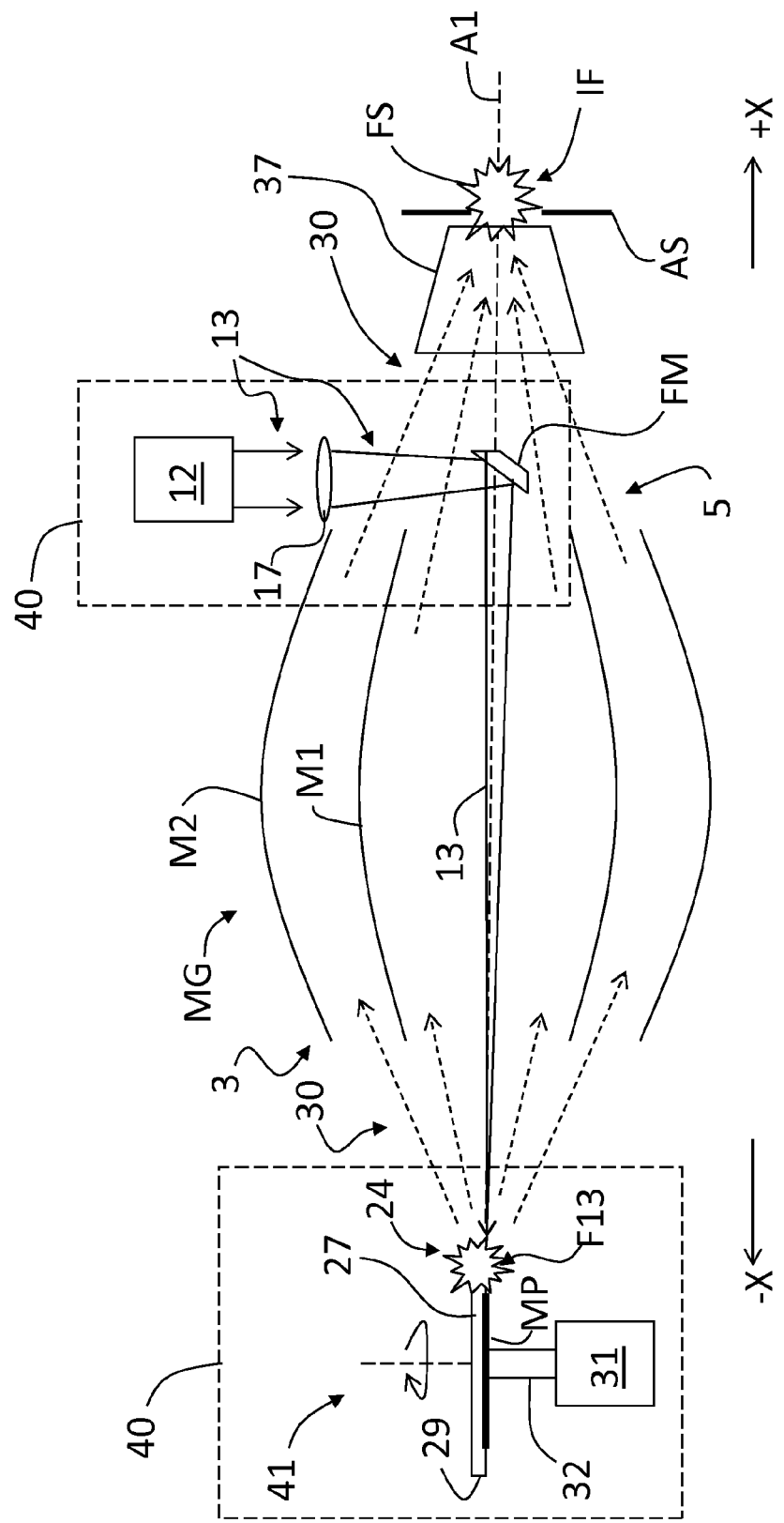

FIG. 6B is similar to FIG. 6A and illustrates an example embodiment of a LPP target system 40 having a solid LPP target 27 in the form of a rotating disc, where the surface 29 of LPP target 27 is now the disc edge rather than the disc face. This embodiment for LPP target system 40 is discussed in greater detail below. Both embodiments of LPP-GIC SOCOMO 100 of FIGS. 6A and 6B include an optional RCED 37.

Example Target Embodiments

Figures 7A, 7B:
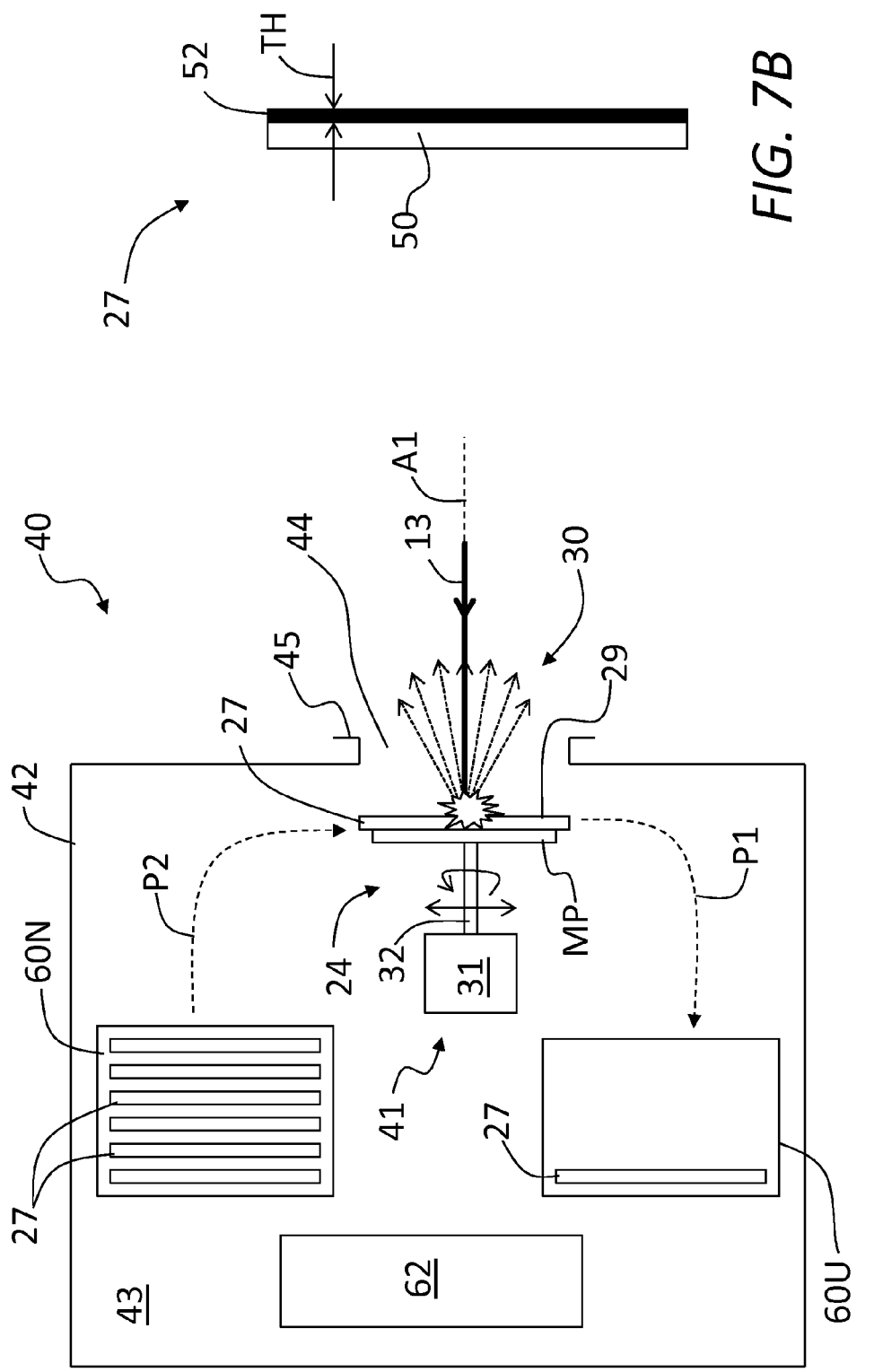
FIG. 7A is a detailed schematic side view of the LPP target system of FIG. 6A.
FIG. 7B is a cross-sectional view of an example LPP target made up of a substrate and a coating of an LPP-generating material formed thereon.

FIG. 7A is a detailed schematic side view of LPP target system 40 of FIG. 6A. LPP target system 40 includes a vacuum chamber 42 having an interior 43 and an opening 44 surrounded by a flange 45 used to connect vacuum chamber 42 to a larger vacuum chamber (not shown) for the LPP-GIC SOCOMO 100.

LPP target system 40 includes the aforementioned target assembly 41 that supports LPP target 27. Target assembly 41 is configured to translate and/or rotate LPP target 27 so that laser beam 13 is scanned (e.g., raster scanned, spiral scanned, etc.) over surface 29 of LPP target 27.

With reference to FIG. 7B, in one embodiment, LPP target 27 is a substrate 50 (e.g., glass, ceramic, metal, etc.) having a coating 52 made of an LPP-generating material such as Sn or Xe. An example thickness TH of coating 52 is between 1 micron and 5 microns. In one embodiment, substrate 50 is a standard blank reticle used in semiconductor manufacturing, with the advantage that handling equipment for such substrates has been developed and is readily available. In another embodiment, substrate 50 is a standard blank compact-disc (CD) used for data storage, except that it is covered with coating 52. Standard handling equipment is also available for such substrates. Both types of substrates can be inexpensively refurbished and reused.

Figure 7C:
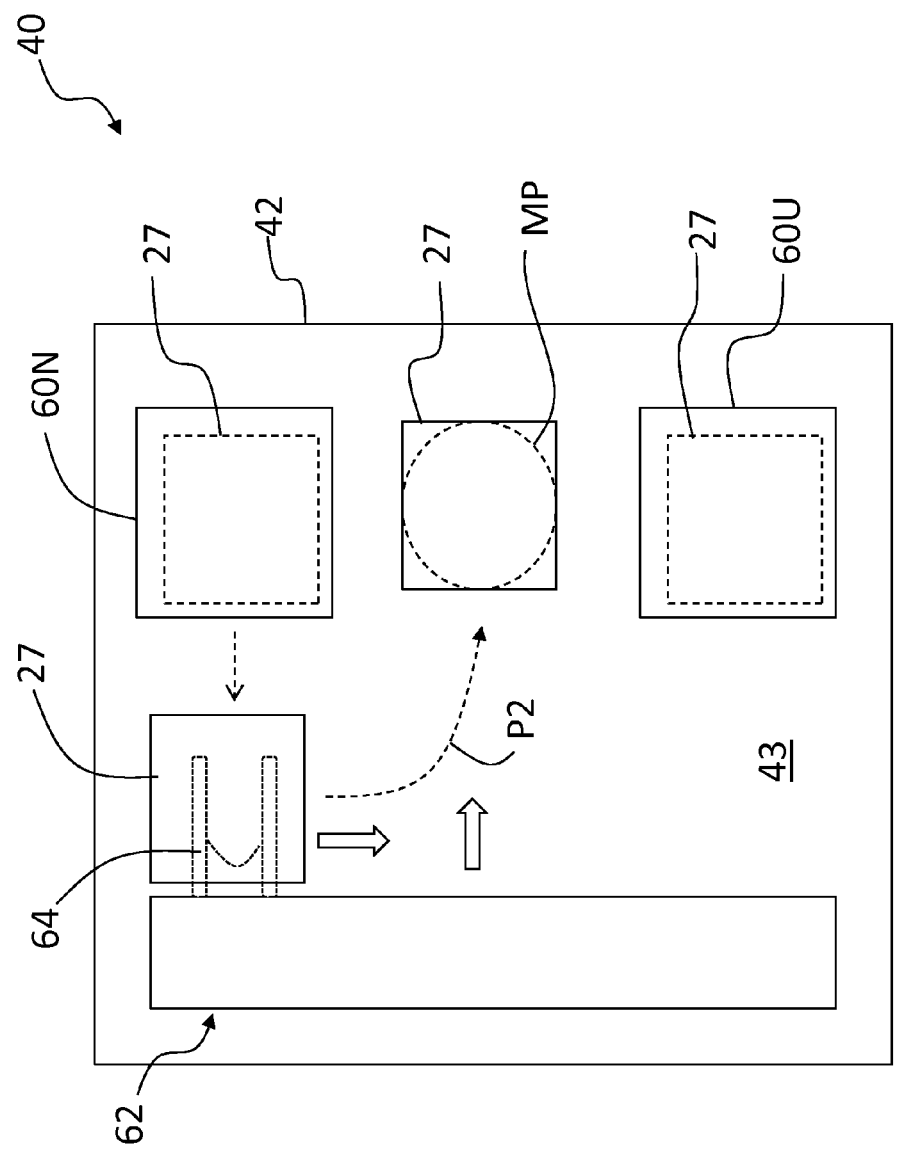
FIG. 7C is a schematic example of a front-on view of the LPP target system of FIG. 7A, showing how the target handler moves new LPP targets from the storage cassette to the mounting plate.

With reference also to the front-on view of FIG. 7C, LPP target system 40 also includes a first cassette 60N for storing new LPP targets 27 and a second cassette 60U for storing used LPP targets 27. LPP target system 40 also includes target handling system 62 configured with a movable target holder 64 to remove used LPP targets 27 from mounting plate MP and move them (via path P1) to the second cassette 60U for storage and to remove (via path P2) new targets from first cassette 60N to the mounting plate MP. In an example embodiment, target handling system 62 makes use of vacuum interlocked robots. Other embodiments include moving (translating) target assembly 41 to move used LPP targets 27 to second cassette 60U and pick up a new LPP target 27 from first cassette 60N. This particular embodiment is best suited for lightweight LPP targets 27.

Figure 7D:
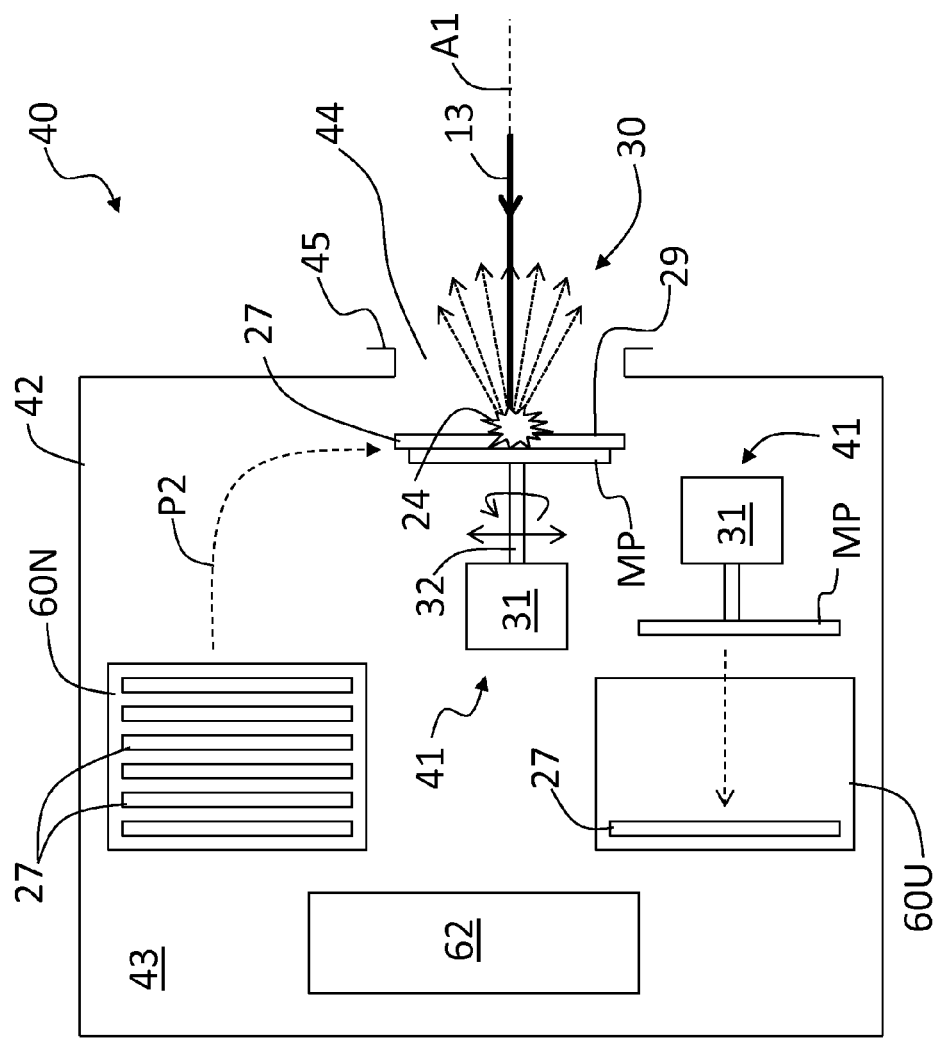
FIG. 7D is similar to FIG. 7A and shows an example LPP target system that utilizes two target assemblies, wherein one target assembly is "on line" and generating the LPP while the other target assembly is "off line" for LPP target removal and replacement.

In another embodiment illustrated in FIG. 7D, a pair of target assemblies 41, with one target assembly 41 being "off-line" to remove a used LPP target 27 and replace it with a new one, while the other target assembly 41 is "on-line" and being used to generate LPP 24.

Figure 8A:
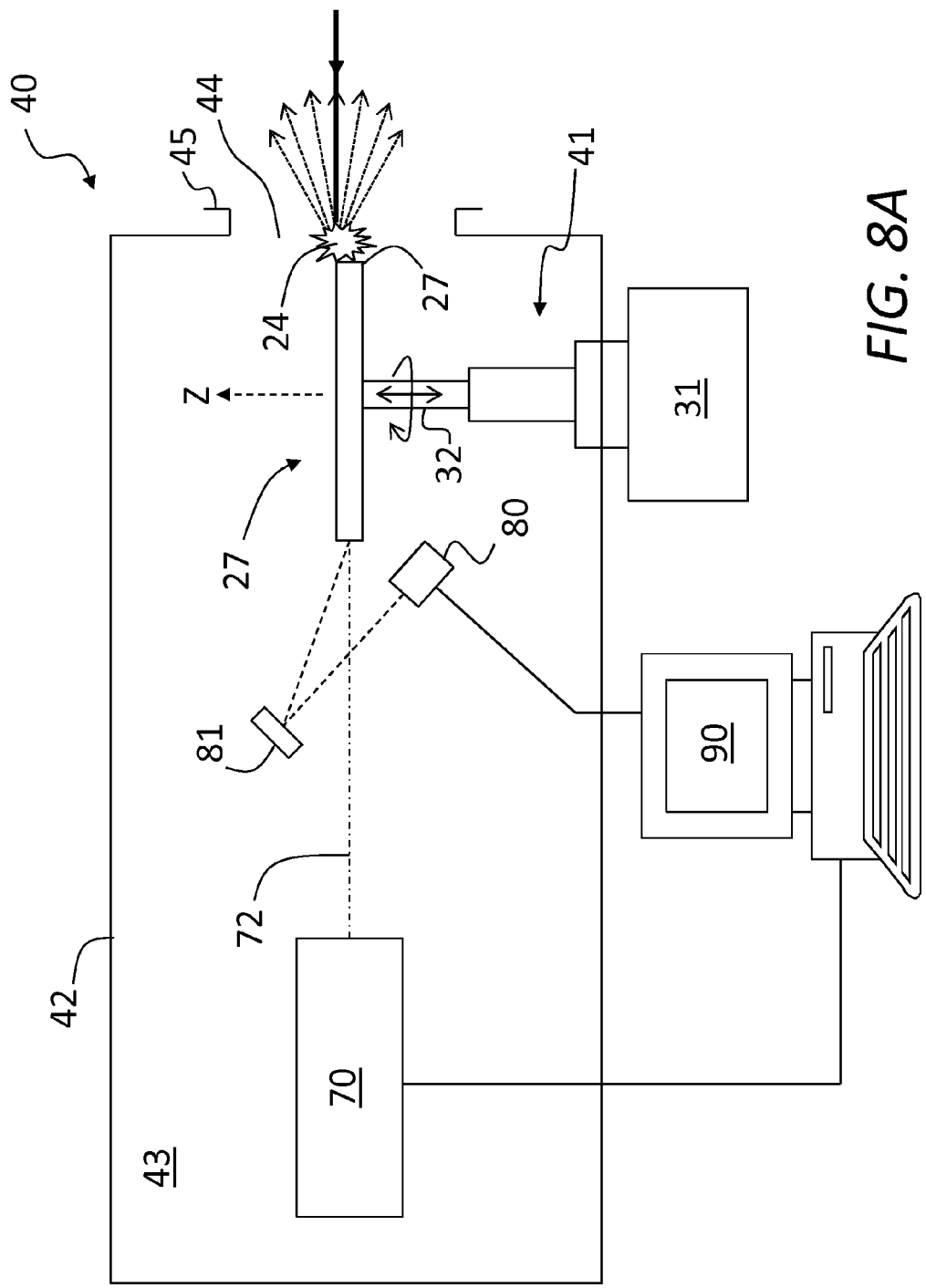
FIG. 8A is a detailed schematic side view of the example LPP target system shown in FIG. 6B and that includes a disc-type LPP target with the target surface on the edge of the disc rather than on the front surface.

FIG. 8A is a detailed schematic side view of the example LPP target system 40 shown in FIG. 6B that includes a disc-type LPP target 27, with the surface 29 of LPP target 27 being on the edge of the disc rather than on its front surface. Target assembly 41 is still used to drive LPP target 27, but now the LPP target 27 is oriented so that laser beam 13 strikes the edge of LPP target 27 (see laser spots 13S formed at angle φ) as the LPP target 27 is driven to rotate about the Z-axis.

FIG. 8B is a perspective view and FIG. 8C is a cross-sectional view of an example LPP target 27 taken along the line 8C-8C that shows substrate 50 with its edge 51 coated with coating 52 made from LPP-generating material. This configuration forms a coating 52 that defines surface 29 of LPP target 27. An example coating width W is between 1 mm and 5 mm, and an example thickness TH of coating 52 is 1 micron to 5 microns.

The LPP target system 40 of FIG. 8A also includes a melting source 70 that emits an energy beam 72 that irradiates surface 29 of LPP target 27 on the side opposite where laser beam 13 is incident upon the surface 29 of LPP target 27. Energy beam 72 serves to locally melt coating 52 to refurbish surface 29 of LPP target 27. Example melting sources 70 include e-beam systems, lasers, heating elements, filaments, etc. A surface finish monitor 80 is arranged relative to where energy beam 72 is incident upon surface 29 of LPP target 27 to monitor the refurbished (refinished) surface 29 of LPP target 27. A fold mirror 81 is shown to facilitate viewing the refurbished surface 29 of LPP target 27 by surface finish monitor 80.

In an example embodiment, LPP target system 40 includes a controller 90 operably connected to target driver 31, melting source 70 and surface finish monitor 80 and is configured to control the overall operation of the LPP target system 40. An example controller 90 includes a computer that can store instructions (software) in a computer readable medium (memory) to cause the computer (via a processor therein) to carry out the instructions to operate LPP target system 40 to generate LPP 24. One example operation of controller 90 is to shift LPP target 27 in the direction of laser beam 13 as the thickness TH of coating 52 decreases while generating LPP 24.

Figure 8D:
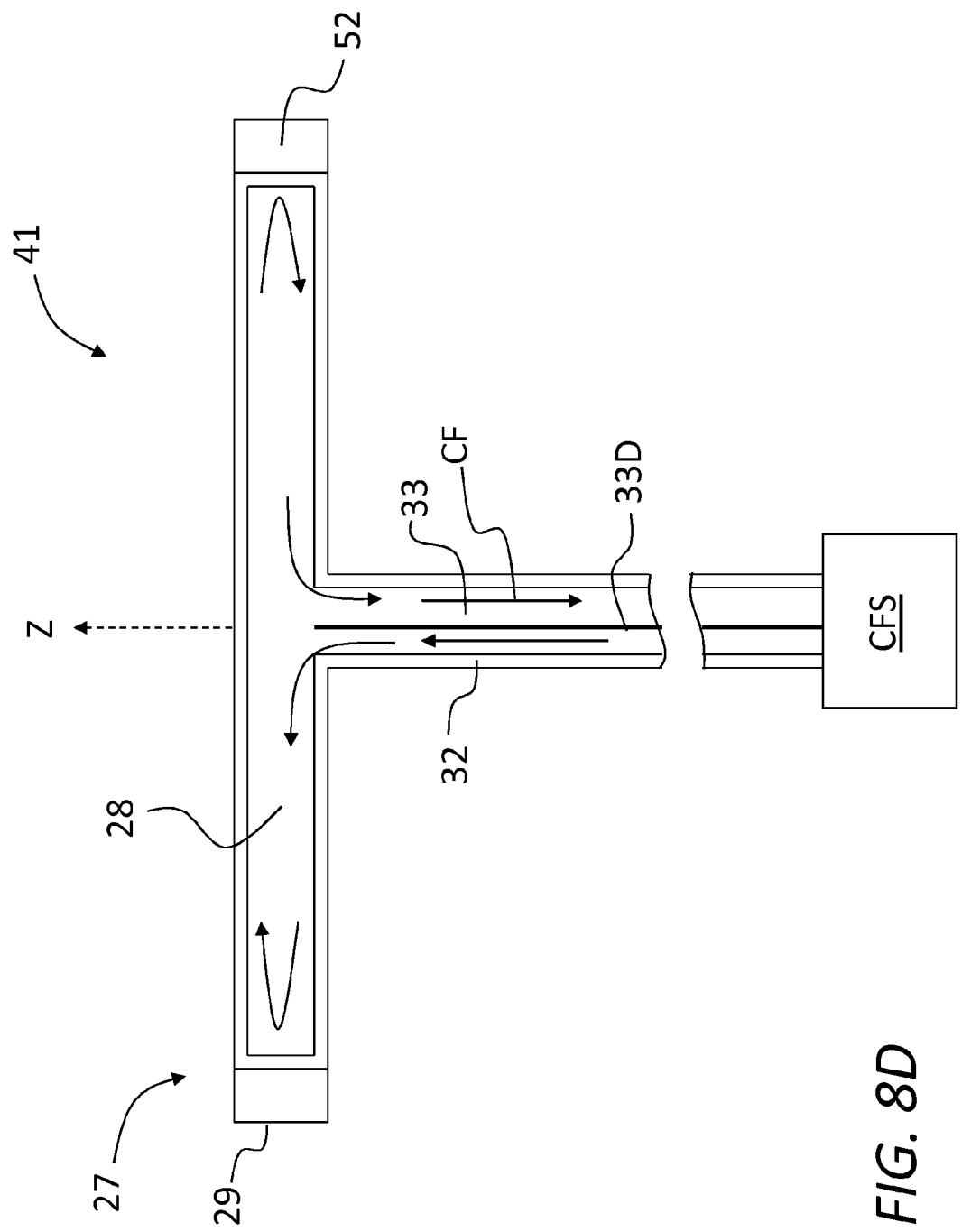
FIG. 8D is a close-up view of example embodiment of a portion of the target assembly illustrating a cooled configuration for the target assembly.

FIG. 8D is a close-up view of example embodiment of a portion of target assembly 41, wherein drive shaft 32 includes a cooling channel 33 with a divider 33D, and wherein LPP target 27 includes an internal target chamber 28. Cooling channel 33 of drive shaft 32 and internal target chamber 28 are fluidly connected so that a cooling fluid CF can flow from a cooling fluid source CFS through cooling channel 33 and to the internal target chamber 28 and then back to the cooling fluid source CFS, as illustrated. Other cooling configurations are contemplated beyond this illustrative example. Such a cooling system is desirable for high-repetition-rates since the attendant differential heating of coating 52 can degrade surface 29 of LPP target 27.

SOCOMO with No First-Mirror Multilayer

An example configuration of LPP-GIC SOCOMO 100 has no multilayer-coated "first mirror," i.e., the mirror or mirror section upon which EUV radiation 30 is first incident (i.e., first reflected) does not have a multilayer coating 18 that covers a significant portion of the reflecting surface. In another example configuration of LPP-GIC SOCOMO 100, the first mirror is substantially a grazing incidence mirror. In an example, only a small section (i.e., a non-significant portion) of the reflective surface has a multilayer coating 18, e.g., for diagnostic purposes.

Figure 9:
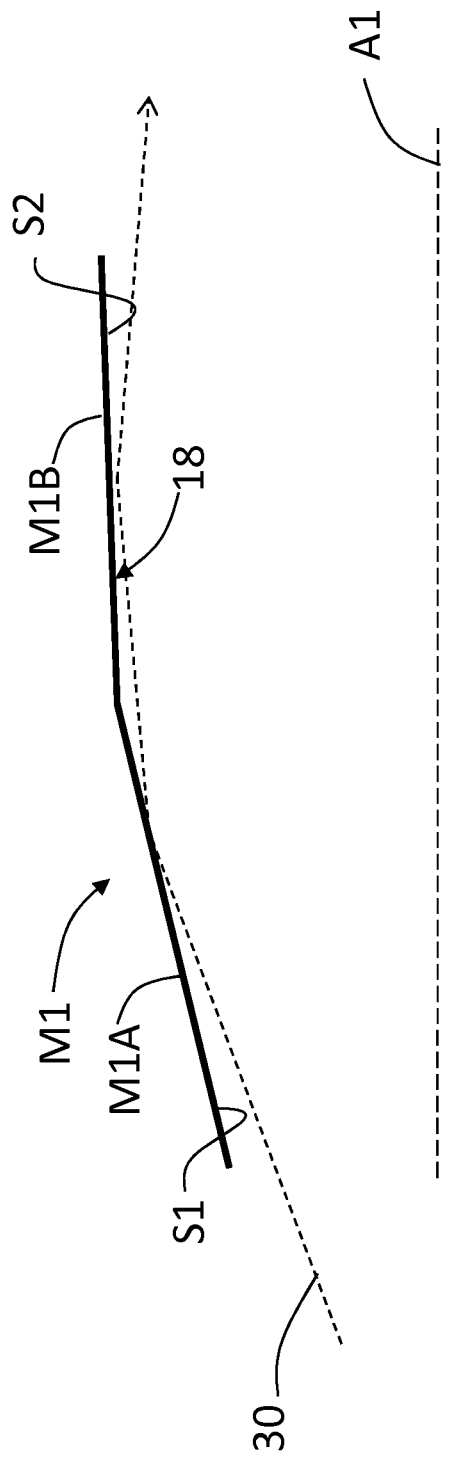
FIG. 9 is a cross-sectional diagram of an example GIC mirror having two sections with respective first and second surfaces that provide first and second reflections of EUV radiation.

A major advantage of LPP-GIC SOCOMO 100 is that its performance is not dependent upon on the survival of a multilayer coated reflective surface. Example embodiments of GIC mirror MG have at least one segmented GIC shell, such as GIC shell M1 shown in FIG. 9. GIC shell M1 is shown as having a two mirror segments M1A and M1B with respective first and second surfaces S1 and S2. First surface S1 provides the first reflection (and is thus the "first mirror") and second surface S2 provides a second reflection that is not in the line of sight to LPP 24. In an example embodiment, second surface S2 supports a multilayer coating 18 since the intensity of the once-reflected EUV radiation 30 is substantially diminished and is not normally in the line of sight of LPP 24, thus minimizing the amount of ions and neutral atoms incident upon the multilayer coating 18. Finally, radiation is also grazingly incident upon the second surface S2 on the second reflection, thereby presenting less risk of damaging multilayer coating 18.

SOCOMO Lifetime

Another advantage of LPP-GIC SOCOMO 100 of the present disclosure is that its anticipated lifetime is in excess of 1 year, which is a commercially viable lifetime for a EUV lithography system used in semiconductor manufacturing. Another advantage is that it supports embodiments wherein the LPP target system 40 need not be based on dispensed Sn pellets (droplets) 22 but rather employs a solid LPP target 27 (see e.g., FIG. 6A and FIG. 6B).

GIC vs. NIC SOCOMOs

There are certain trade-offs associated with using a LPP-GIC SOCOMO 100 versus a LPP-NIC SOCOMO 10. For example, for a given collection angle of the EUV radiation 30 from the LPP 24, the LPP-NIC SOCOMO 10 can be designed to be more compact than the LPP-GIC SOCOMO 100.

Also, the LPP-NIC SOCOMO 10 can in principle be designed to collect EUV radiation 30 emitted from the source at angles larger than 90° (with respect to the optical axis A1), thus allowing larger collection efficiency. However, in practice this advantage is not normally used because it leads to excessive NIC diameters or excessive angles that the EUV radiation 30 forms with the optical axis A1 at intermediate focus IF.

Also, the far field intensity distribution generated by a LPP-GIC SOCOMO 100 has additional obscurations due to the shadow of the thickness of the GIC shells and of the mechanical structure supporting the GIC mirrors MG. However, the present disclosure discusses embodiments below where the GIC surface includes a surface correction that mitigates the shadowing effect of the GIC shells thicknesses and improves the uniformity of the intermediate focus spot FS at the intermediate focus IF.

Further, the intermediate focus spot FS at intermediate focus IF will in general be larger for a LPP-GIC SOCOMO 100 than for a LPP-NIC SOCOMO 10. This size difference is primarily associated with GIC mirror figure errors, which are likely to decrease as the technology evolves.

On the whole, it is generally believed that the above-mentioned trade-offs are far outweighed by the benefits of a longer operating lifetime, reduced cost, simplicity, and reduced maintenance costs and issues associated with a LPP-GIC SOCOMO 100.

LPP-GIC SOCOMO with Debris Mitigation

Figure 10:
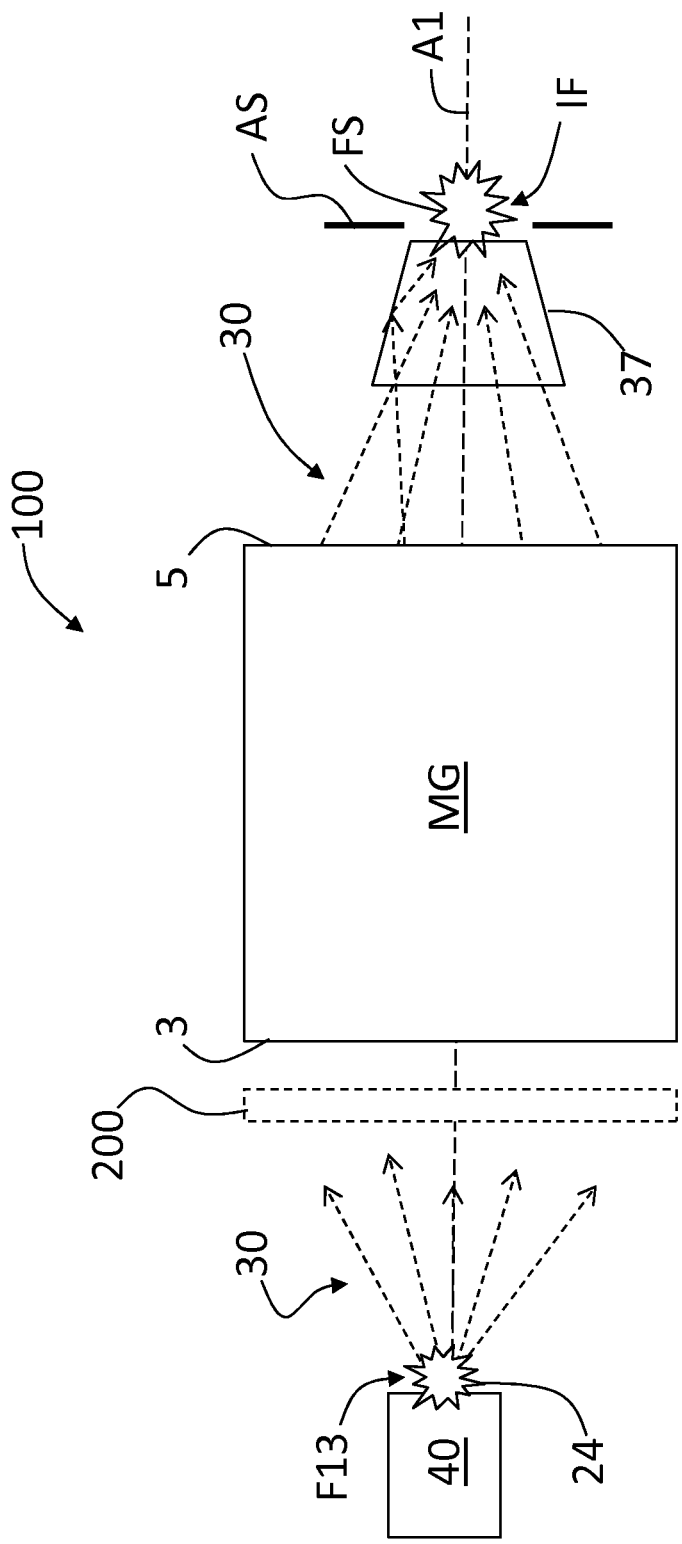
FIG. 10 is a schematic diagram similar to FIG. 3 and that illustrates an embodiment of a LPP-GIC SOCOMO with a debris mitigation device arranged between the LPP and GIC mirror and an optional RCED.

FIG. 10 illustrates an example embodiment of generalized a LPP-GIC SOCOMO 100 similar to FIG. 3B but that includes a debris mitigation device (DMD) 200 arranged between LPP 24 and GIC mirror MG. DMD 200 is shown in phantom to illustrate the fact that it typically passes EUV radiation 30 while blocking other damaging ions and particles (e.g., such as energetic Sn ions) from LPP 24. DMD 200 may also be configured to remove debris, such as Sn, formed in GIC mirror MG. Optional RCED 37 is shown in FIG. 10.

Example DMDs 200 include those used in LPP-NIC SOCOMO technology, such as magnetic-field-based DMDs or DMDs based on a plurality of radial metal lamellas. Example DMDs are discussed in U.S. Pat. Nos. 7,230,258, 7,423,275, 7,372,049, 7,355,190 and 7,193,229, 7,180,083 and 6,963,071, which patents are incorporated herein by reference, and also in the article by D. J. W. Klunder, et al., "Debris Mitigation and Cleaning Strategies for Sn-Based Sources for EUV Lithography," Proceedings of SPIE, vol. 5751, pp. 943-951, which article is incorporated by reference herein.

Example GIC Mirror for LPP-GIC SOCOMO

Figure 11:
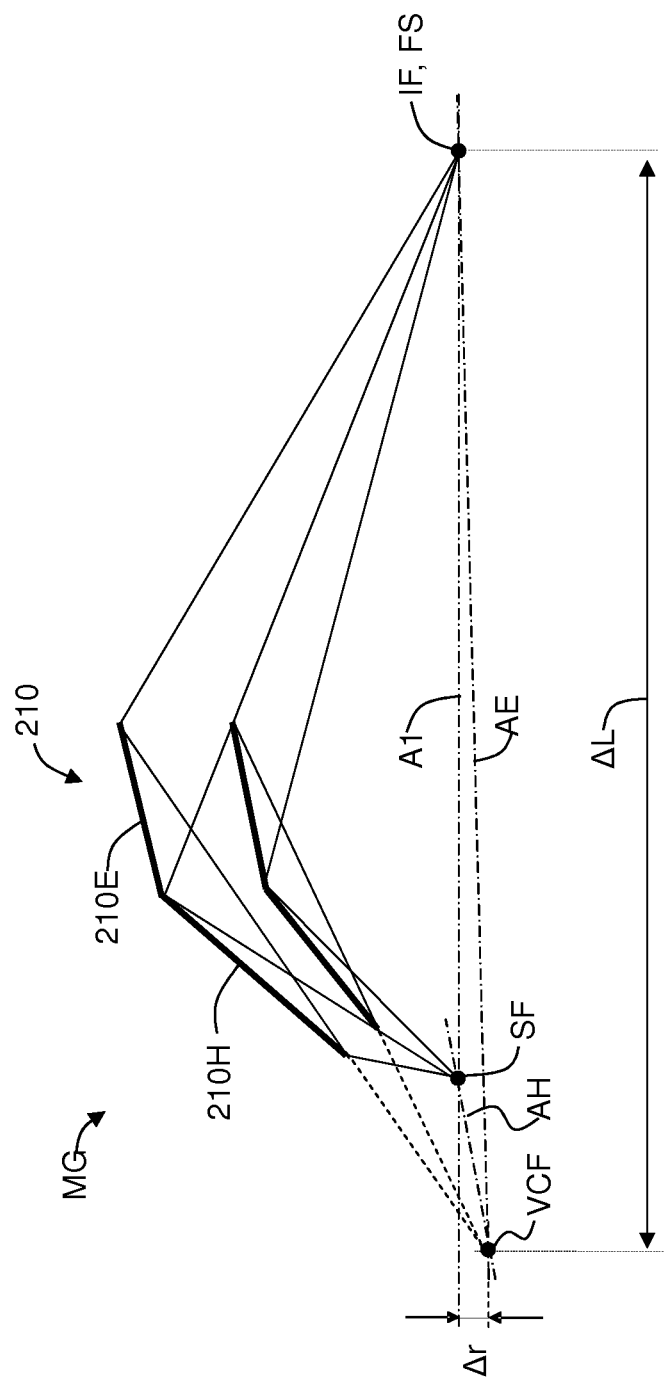
FIG. 11 is a schematic cross-sectional diagram of a portion of an example GIC mirror showing two of the two-section GIC shells used in the outer portion of the GIC mirror.
Figure 12:
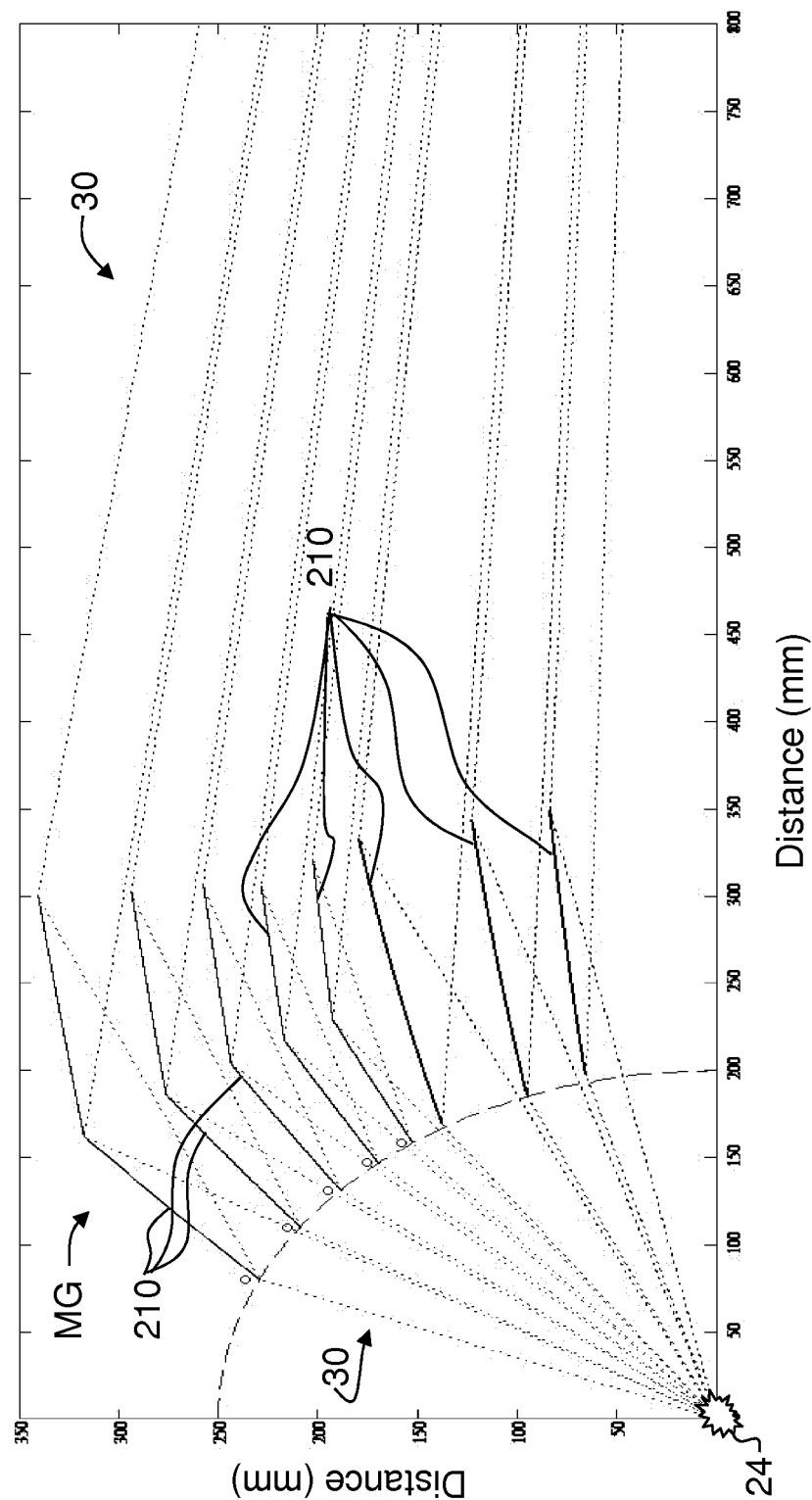
FIG. 12 is a schematic cross-sectional diagram of a portion of the GIC mirror of FIG. 11 showing all eight GIC shells and the LPP.

FIG. 11 is a schematic side view of a portion of an example GIC mirror MG for use in LPP-GIC SOCOMO 100. The optical design of GIC mirror MG of FIG. 11 actually consists of eight nested GIC shells 210 with cylindrical symmetry around the optical axis A1, as shown in FIG. 12. To minimize the number of GIC shells 210, the first three innermost GIC shells 210 are elliptical, whereas the five outermost GIC shells 210 are based on an off-axis double-reflection design having elliptical and hyperbolic cross sections, such as described in European Patent Application Publication No. EP1901126A1, entitled "A collector optical system," which application is incorporated by reference herein. FIG. 11 shows two of the outermost GIC shells 210 having an elliptical section 210E and a hyperboloidal section 210H. FIG. 11 also shows the source focus SF, the virtual common focus VCF, and the intermediate focus IF, as well as the axes AE and AH for the elliptical and hyperboloidal GIC shells 210E and 210H, respectively. The distance between virtual common focus VCF and intermediate focus IF is ΔL. The virtual common focus VCF is offset from the optical axis A1 by a distance Δr. The full optical surface is obtained by a revolution of the cross sections of the elliptical and hyperboloidal GIC shells 210E and 210H around the optical axis A1.

Example designs for the example GIC mirror MG are provided in Table 1 and Table 2 below. The main optical parameters of the design are: a) a distance ΔL between LPP 24 and intermediate focus IF of 2400 mm; and b) a maximum collection angle at the LPP side of 70.7°. In an example embodiment, GIC shells 210 each include a Ru coating for improved reflectivity at EUV wavelengths. The nominal collection efficiency of the GIC mirror MG for EUV radiation 30 of wavelength of 13.5 nm when the optical surfaces of GIC shells 210 are coated with Ru is 37.6% with respect to $2\pi$ steradians emission from LPP 24.

Since an LPP EUV source is much smaller than a discharge-produced plasma (DPP) EUV source (roughly by a factor of 10), the use of LPP 24 allows for better etendue matching between the GIC mirror output and the illuminator input. In particular, the collection angle at LPP 24 can be increased to very large values with negligible or very limited efficiency loss due to mismatch between the GIC mirror MG and illuminator etendue. In an example embodiment, the collection angle exceeds 70°.

The dimension of LPP 24 has a drawback in that the uniformity of the intensity distribution in the far field tend to be worse than for a DPP source, for a given collector optical design. Indeed, since the LLP 24 is smaller, the far-field shadows due to the thicknesses of GIC shells 210 tend to be sharper for an LPP source than for a DPP source.

To compensate at least partially for this effect, a surface figure (i.e., optical profile) correction is added to each GIC shell 210 to improve the uniformity of the intensity distribution in the far field (see, e.g., Publication No. WO2009-095219 A1, entitled "Improved grazing incidence collector optical systems for EUV and X-ray applications," which publication is incorporated by reference herein). Thus, in an example embodiment of GIC mirror MG, each GIC shell 210 has superimposed thereon a polynomial (parabolic) correction equal to zero at the two edges of the GIC shells 210 and having a maximum value of 0.01 mm.

Table 1 and Table 2 set forth an example design for the GIC mirror MG shown in FIG. 10. The "mirror #" is the number of the particular GIC shell 210 as numbered starting from the innermost GIC shell 210 to the outermost GIC shell 210.

Example EUV lithography systems are disclosed, for example, in U.S. Patent Applications No. US2004/0265712A1, US2005/0016679A1 and US2005/0155624A1, which are incorporated herein by reference.

Lithography system 300 includes a system axis ASy and an EUV light source LS that includes an LPP target system 40, such as one of those discussed above, which generates LPP 24 that emits working EUV radiation 30 at $\lambda=13.5$ nm.

Lithography system 300 includes an EUV GIC mirror MG such as that described above. In an example embodiment, EUV GIC mirror MG is cooled as described in U.S. patent application Ser. No. 12/592,735, which is incorporated by reference herein. EUV GIC mirror MG is arranged adjacent and downstream of EUV light source LS, with collector axis AC lying along system axis ASy. EUV GIC mirror MG collects working EUV radiation 30 (i.e., light rays LR) from EUV light source LS located at source focus SF and the collected radiation forms intermediate source image IS (i.e., intermediate focus spot FS) at intermediate focus IF. In an

TABLE 1

| | Hyperbola | | Ellipse | | Mirror radii [mm] | | |
|---|---|---|---|---|---|---|---|
| Mirror # | Conic Constant | Radius of curvature [mm] | Conic Constant | Radius of curvature [mm] | Maximum | Ellipse-hyperbola joint | Minimum |
| 1 | — | — | −0.990478 | 11.481350 | 83.347856 | — | 65.369292 |
| 2 | — | — | −0.979648 | 24.674461 | 122.379422 | — | 94.644337 |
| 3 | — | — | −0.957302 | 52.367323 | 179.304368 | — | 137.387744 |
| 4 | −1.066792 | 29.401382 | −0.963621 | 61.100890 | 202.496127 | 192.634298 | 152.384167 |
| 5 | −1.072492 | 34.268782 | −0.949865 | 86.379783 | 228.263879 | 216.839614 | 169.639161 |
| 6 | −1.090556 | 46.865545 | −0.941216 | 104.704248 | 257.297034 | 243.541412 | 188.559378 |
| 7 | −1.111163 | 61.694607 | −0.926716 | 134.626393 | 293.432077 | 276.198514 | 208.671768 |
| 8 | −1.134540 | 81.393448 | −0.905453 | 180.891785 | 340.258110 | 317.294990 | 229.102808 |

TABLE 2

| | Position of virtual common focus VCF with respect to intermediate focus IF | |
|---|---|---|
| Mirror # | ΔL, parallel to optical axis A1 [mm] | Δr, transverse to optical axis A1 [mm] |
| 1 | — | — |
| 2 | — | — |
| 3 | — | — |
| 4 | 3293.000000 | 171.500000 |
| 5 | 3350.000000 | 237.000000 |
| 6 | 3445.000000 | 276.300000 |
| 7 | 3521.000000 | 335.250000 |
| 8 | 3616.000000 | 426.950000 |

Figure 13B:
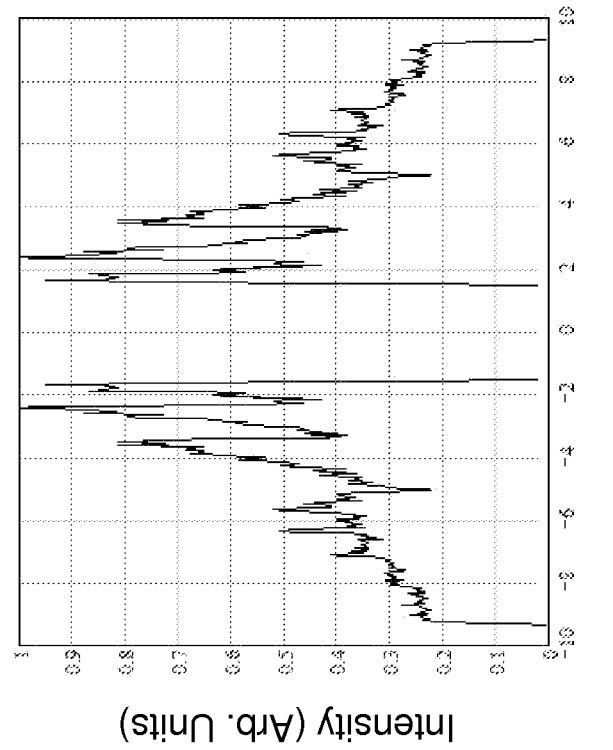
FIG. 13B is the same plot as FIG. 13A, but with a polynomial surface-figure correction that improves the far-field image uniformity.
Figure 13A:
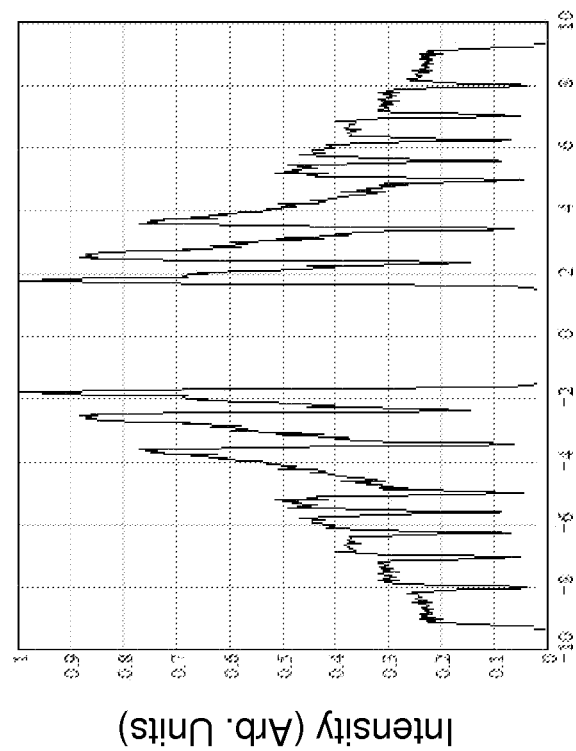
FIG. 13A is a plot of the normalized far-field position vs. Intensity (arbitrary units) for the case where the GIC shells do not include a polynomial surface-figure correction to improve the far-field image uniformity.

FIG. 13A is a plot of the normalized far-field position at the intermediate focus IF vs. intensity (arbitrary units) for light rays incident thereon for the case where there is no correction of the GIC shell profile. The plot is a measure of the uniformity of the intermediate image (i.e., "intermediate focus spot" FS) of LPP 24 as formed at the intermediate focus IF. LPP 24 is modeled as a sphere with a 0.2 mm diameter.

FIG. 13B is the same plot except with the above-described correction added to GIC shells 210. The comparison of the two plots of FIG. 13A and FIG. 13B shows substantially reduced oscillations in intensity in FIG. 13B and thus a significant improvement in the far field uniformity the intermediate focus spot FS at the intermediate focus IF as a result of the corrected surface figures for the GIC shells 210.

EUV Lithography System with LPP-GIC SOCOMO

Figure 14:
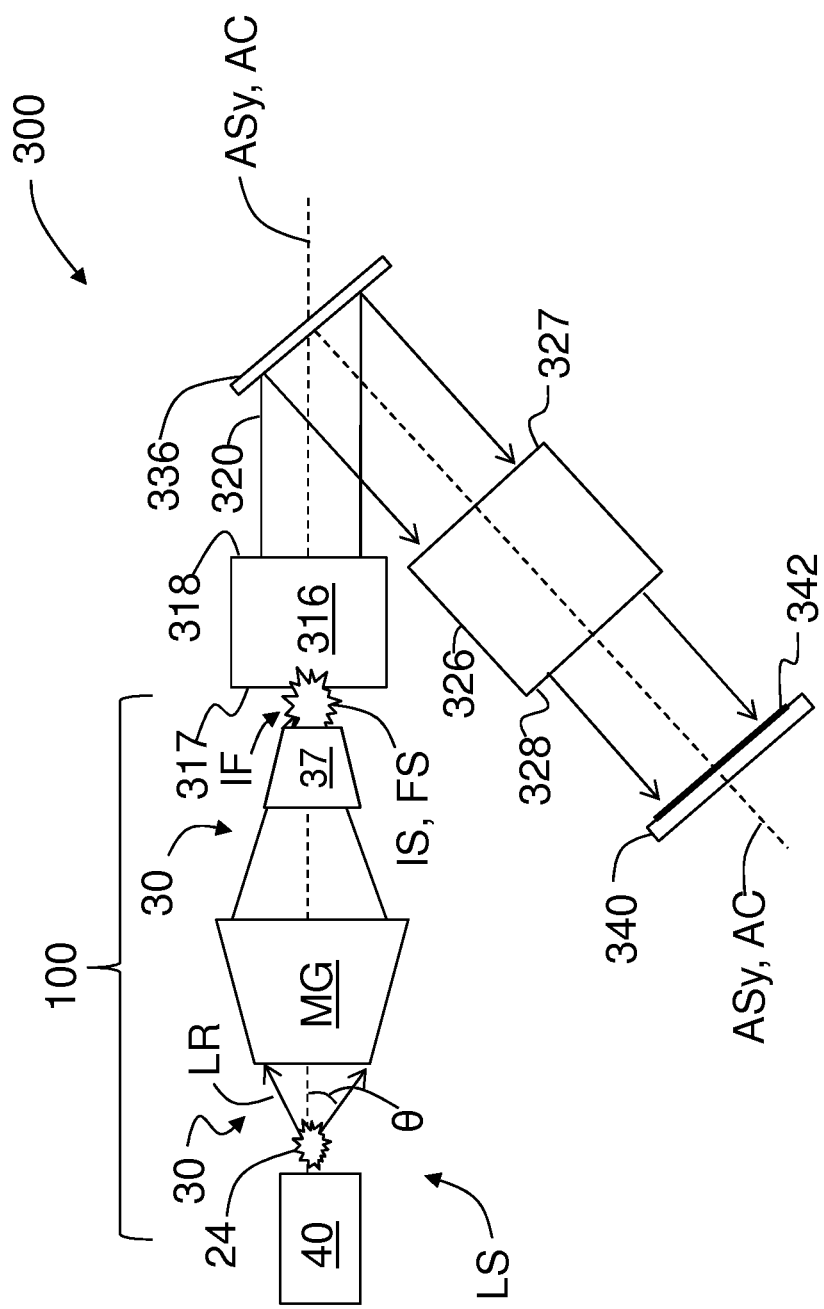
FIG. 14 is a schematic diagram of an EUV lithography system that utilizes the LPP-GIC SOCOMO of the present disclosure.

FIG. 14 is an example EUV lithography system ("lithography system") 300 according to the present disclosure.

example, LPP-GIC SOCOMO 100 comprises EUV light source LS and GIC mirror MG. Optional RCED 37 is shown by way of example.

An illumination system 316 with an input end 317 and an output end 318 is arranged along system axis ASy and adjacent and downstream of EUV GIC mirror MG with the input end 317 adjacent the EUV GIC mirror MG. Illumination system 316 receives at input end 317 EUV radiation 30 from intermediate source image IS and outputs at output end 318 a substantially uniform EUV radiation beam 320 (i.e., condensed EUV radiation). Where lithography system 300 is a scanning type system, EUV radiation beam 320 is typically formed as a substantially uniform line or ring field of EUV radiation 30 at a reflective reticle (mask) 336 that scans over the reflective reticle 336.

A projection optical system 326 is arranged along (folded) system axis ASy downstream of illumination system 316. Projection optical system 326 has an input end 327 facing output end 318 of illumination system 316, and an opposite output end 328. A reflective reticle 336 is arranged adjacent the input end 327 of projection optical system 326 and a semiconductor wafer 340 is arranged adjacent output end 328 of projection optical system 326. Reflective reticle 336 includes a pattern (not shown) to be transferred to semiconductor wafer 340, which includes a photosensitive coating (e.g., photoresist layer) 342. In operation, the uniformized EUV radiation beam 320 irradiates reflective reticle 336 and reflects therefrom, and the pattern thereon is imaged onto surface of photosensitive coating 342 of semiconductor wafer 340 by projection optical system 326. In a lithography scanning system 300, the reticle image scans over the surface of photosensitive coating 342 to form the pattern over the exposure field. Scanning is typically achieved by moving reflective reticle 336 and semiconductor wafer 340 in synchrony.

Once the reticle pattern is imaged and recorded on semiconductor wafer 340, the patterned semiconductor wafer 340 is then processed using standard photolithographic and semiconductor processing techniques to form integrated circuit (IC) chips.

Note that in general the components of lithography system 300 are shown lying along a common folded system axis ASy in FIG. 14 for the sake of illustration. One skilled in the art will understand that there is often an offset between entrance and exit axes for the various components such as for illumination system 316 and for projection optical system 326.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

The invention claimed is:

1. A source-collector module for an extreme ultraviolet (EUV) lithography system, comprising:
    a laser that generates along a source-collector module axis a pulsed laser beam having a series of pulses;
    a solid laser-produced plasma (LPP) target having a moving target surface configured to receive the pulsed laser beam with each laser pulse being incident upon the target surface at a different location to create a LPP that generates EUV radiation and debris; and
    a grazing-incidence collector (GIC) mirror having an input end and an output end and arranged to receive the EUV radiation at the input end and grazingly reflect the EUV radiation at least once to direct the received EUV radiation to an intermediate focus adjacent the output end;
    a debris mitigation device operably disposed between the solid LPP target and the input end of the GIC mirror to substantially prevent the debris from reaching the GIC mirror; and
    a radiation-collection enhancement device disposed between the GIC mirror output end and the intermediate focus and configured to direct a portion of the at least once grazingly reflected EUV radiation that exits the output end of the GIC mirror to the intermediate focus.

2. The source-collector module of claim 1, wherein the debris mitigation device comprises a plurality of radial lamellas that rotate to intercept the debris as the debris travels from the LPP to the GIC mirror.

3. The source-collector module of claim 1, wherein the GIC mirror provides a first reflecting surface that does not have a multilayer coating covering a significant portion of the first reflecting surface.

4. The source-collector module of claim 1, wherein the GIC mirror includes a Ru coating.

5. The source-collector module of claim 1, wherein the GIC mirror includes a multilayer coating.

6. The source-collector module of claim 1, wherein the GIC mirror includes at least one segmented GIC shell having the first reflecting surface and a second reflecting surface, with the second reflecting surface having a multilayer coating.

7. The source-collector module of claim 1, wherein the laser beam travels through the GIC from the output end to the input end, through the debris mitigation device and then to the LPP target surface.

8. The source-collector module of claim 1, wherein the LPP target surface includes a coating of LPP-generating material formed atop a substrate.

9. The source-collector module of claim 1, wherein the LPP target surface includes one of Sn and Xe.

10. An extreme ultraviolet (EUV) lithography system for illuminating a reflective reticle, comprising:
    the source-collector module of claim 1;
    an illuminator configured to receive the EUV radiation directed to the intermediate focus by the GIC mirror and the radiation-collection enhancement device and form therefrom condensed EUV radiation for illuminating the reflective reticle.

11. The EUV lithography system of claim 10 for forming a patterned image on a photosensitive semiconductor wafer, further comprising:
    a projection optical system arranged downstream of the reflective reticle and configured to receive reflected EUV radiation from the reflective reticle and form therefrom the patterned image on the photosensitive semiconductor wafer.

* * * * *